United States Patent
Nakagawa et al.

(10) Patent No.: US 12,050,268 B2
(45) Date of Patent: Jul. 30, 2024

(54) SYSTEM TO MEASURE A DISTANCE TO AN OBJECT WITHOUT ADDITION OF A DISTANCE MEASURING SENSOR

(71) Applicants: SONY GROUP CORPORATION, Tokyo (JP); SONY SEMICONDUCTOR SOLUTIONS CORPORATION, Kanagawa (JP)

(72) Inventors: Kei Nakagawa, Tokyo (JP); Katsuhiko Hanzawa, Kanagawa (JP)

(73) Assignees: SONY GROUP CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/760,391

(22) PCT Filed: Nov. 17, 2020

(86) PCT No.: PCT/JP2020/042717
§ 371 (c)(1),
(2) Date: Aug. 9, 2022

(87) PCT Pub. No.: WO2021/166344
PCT Pub. Date: Aug. 26, 2021

(65) Prior Publication Data
US 2023/0062562 A1 Mar. 2, 2023

(30) Foreign Application Priority Data
Feb. 18, 2020 (JP) .................................. 2020-024820

(51) Int. Cl.
*G01S 17/89* (2020.01)
*G01S 7/4914* (2020.01)
(Continued)

(52) U.S. Cl.
CPC ............ *G01S 17/89* (2013.01); *G01S 7/4914* (2013.01); *G01S 7/4915* (2013.01);
(Continued)

(58) Field of Classification Search
CPC ............ G01S 17/88; G01S 17/89; G01S 7/49; G01S 11/00; G01S 11/12; G01S 17/00; G01S 19/00; H01L 27/146
(Continued)

(56) References Cited

U.S. PATENT DOCUMENTS

| | | | |
|---|---|---|---|
| 2010/0127183 A1* | 5/2010 | Iseki | A61N 5/1043 250/396 ML |
| 2020/0029032 A1* | 1/2020 | Mahara | H04N 23/60 |
| 2020/0183013 A1* | 6/2020 | Iguchi | G01S 7/486 |

FOREIGN PATENT DOCUMENTS

| | | |
|---|---|---|
| JP | 2018-088488 A | 6/2018 |
| JP | 2018-124271 A | 8/2018 |

(Continued)

OTHER PUBLICATIONS

International Search Report and Written Opinion of PCT Application No. PCT/JP2020/042717, issued on Feb. 9, 2021, 09 pages of ISRWO.

*Primary Examiner* — Jennifer D Bennett
(74) *Attorney, Agent, or Firm* — CHIP LAW GROUP

(57) ABSTRACT

Provided is a sensing system that includes a light emitting section, a predetermined number of pixels, a solid-state imaging element, and a counting section. In the solid-state imaging element, the light emitting section emits irradiation light in synchronization with a light emission control signal having a higher frequency than a vertical synchronization signal. Each of the predetermined number of pixels generates a pulse signal by photoelectric conversion and the counting section counts a number of pulse signals in syn-
(Continued)

chronization with each of the light emission control signal and the vertical synchronization signal.

17 Claims, 32 Drawing Sheets

(51) Int. Cl.
*G01S 7/4915* (2020.01)
*G01S 17/894* (2020.01)
*H01L 27/146* (2006.01)
*H04N 25/77* (2023.01)

(52) U.S. Cl.
CPC .......... *G01S 17/894* (2020.01); *H01L 27/146* (2013.01); *H04N 25/77* (2023.01)

(58) Field of Classification Search
USPC .................................. 250/221, 214 R, 208.1
See application file for complete search history.

(56) References Cited

FOREIGN PATENT DOCUMENTS

| WO | 2018/221048 A1 | 12/2018 |
| WO | 2019/150785 A1 | 8/2019 |

* cited by examiner

| | DISTANCE MEASURING MODE | IMAGING MODE |
|---|---|---|
| COUNTER #1-4 | COUNTING IN SYNCHRONIZATION WITH EN1 (0 DEGREES), EN2 (90 DEGREES), EN3 (180 DEGREES), AND EN4 (270 DEGREES) | — |
| COUNTER #5-13 | — | COUNTING IN SYNCHRONIZATION WITH VSYNC |

FIG. 17

| | DISTANCE MEASURING MODE | IMAGING MODE |
|---|---|---|
| COUNTER #1 | COUNTING IN SYNCHRONIZATION WITH EN1 (0 DEGREES) | COUNTING IN SYNCHRONIZATION WITH VSYNC |
| COUNTER #2 | — | |
| COUNTER #3 | COUNTING IN SYNCHRONIZATION WITH EN2 (90 DEGREES) | |
| COUNTER #4 | — | |
| COUNTER #5 | — | |
| COUNTER #6 | — | |
| COUNTER #7 | COUNTING IN SYNCHRONIZATION WITH EN3 (180 DEGREES) | |
| COUNTER #8 | — | |
| COUNTER #9 | COUNTING IN SYNCHRONIZATION WITH EN4 (270 DEGREES) | |

FIG. 20

|  | DISTANCE MEASURING MODE | IMAGING MODE |
|---|---|---|
| COUNTER #1 | COUNTING IN SYNCHRONIZATION WITH EN1 (0 DEGREES) | COUNTING IN SYNCHRONIZATION WITH VSYNC |
| COUNTER #2 | COUNTING IN SYNCHRONIZATION WITH EN2 (360 DEGREES) | |
| COUNTER #3 | COUNTING IN SYNCHRONIZATION WITH EN3 (90 DEGREES) | |
| COUNTER #4 | COUNTING IN SYNCHRONIZATION WITH EN4 (450 DEGREES) | |
| COUNTER #5 | COUNTING IN SYNCHRONIZATION WITH EN5 (720 DEGREES) | |
| COUNTER #6 | COUNTING IN SYNCHRONIZATION WITH EN6 (630 DEGREES) | |
| COUNTER #7 | COUNTING IN SYNCHRONIZATION WITH EN7 (270 DEGREES) | |
| COUNTER #8 | COUNTING IN SYNCHRONIZATION WITH EN8 (540 DEGREES) | |
| COUNTER #9 | COUNTING IN SYNCHRONIZATION WITH EN9 (180 DEGREES) | |

FIG. 23

|  | DISTANCE MEASURING MODE | IMAGING MODE |
|---|---|---|
| COUNTER #1 | COUNTING IN SYNCHRONIZATION WITH EN1 (0 DEGREES) | COUNTING IN SYNCHRONIZATION WITH VSYNC |
| COUNTER #2 | COUNTING IN SYNCHRONIZATION WITH EN2 (90 DEGREES) | |
| COUNTER #3 | COUNTING IN SYNCHRONIZATION WITH EN3 (180 DEGREES) | |
| COUNTER #4 | COUNTING IN SYNCHRONIZATION WITH EN4 (270 DEGREES) | |
| COUNTER #5 | — | |
| COUNTER #6 | COUNTING IN SYNCHRONIZATION WITH EN6 (270 DEGREES) | |
| COUNTER #7 | COUNTING IN SYNCHRONIZATION WITH EN7 (180 DEGREES) | |
| COUNTER #8 | COUNTING IN SYNCHRONIZATION WITH EN8 (90 DEGREES) | |
| COUNTER #9 | COUNTING IN SYNCHRONIZATION WITH EN9 (0 DEGREES) | |

| CONTROL SIGNAL | DISTANCE MEASURING MODE | | | IMAGING MODE |
|---|---|---|---|---|
| | FOUR-PIXEL ADDITION MODE | TWO-PIXEL ADDITION MODE | | |
| EN1a | SIGNAL OF 0 DEGREES | SIGNAL OF 0 DEGREES | — | — |
| EN1b | SIGNAL OF 0 DEGREES | — | SIGNAL OF 0 DEGREES | — |
| CTRL | 0 (OR GATE SIDE) | | | 1 (P1 SIDE) |

SYSTEM TO MEASURE A DISTANCE TO AN OBJECT WITHOUT ADDITION OF A DISTANCE MEASURING SENSOR

CROSS REFERENCE TO RELATED APPLICATIONS

This application is a U.S. National Phase of International Patent Application No. PCT/JP2020/042717 filed on Nov. 17, 2020, which claims priority benefit of Japanese Patent Application No. JP 2020-024820 filed in the Japan Patent Office on Feb. 18, 2020. Each of the above-referenced applications is hereby incorporated herein by reference in its entirety.

TECHNICAL FIELD

The present technology relates to a sensing system. Specifically, the present technology relates to a sensing system and a distance measuring system that count the number of pulses.

BACKGROUND ART

In recent years, a device called a single photon avalanche diode (SPAD) that captures considerably weak optical signals and realizes optical communication, distance measurement, photon counting, and the like has been developed and studied. The SPAD is an avalanche photodiode having such high sensitivity that one photon can be detected. For example, a solid-state imaging element has been proposed in which a pixel that generates a pulse signal by using the SPAD and a counter that counts the number of the pulse signals within an exposure period are arranged (see, for example, Patent Document 1).

CITATION LIST

Patent Document

Patent Document 1: WO 2019/150785 A

SUMMARY OF THE INVENTION

Problems to be Solved by the Invention

In the above-described conventional technology, weak light is detected by using a high-sensitivity SPAD, so that an image quality is improved when imaging is performed in a dark environment. However, the above-described solid-state imaging element cannot measure a distance to the object in the captured image. In a case where a distance measuring sensor using infrared rays or lasers is added to perform distance measurement, the power consumption and cost of the system increase, which is not preferable.

The present technology has been made in view of such a situation, and an object thereof is to measure a distance to an object without adding a distance measuring sensor in a system that captures image data.

Solutions to Problems

The present technology has been made to solve the above-described problems, and a first aspect thereof is a sensing system including: a light emitting section that emits irradiation light in synchronization with a light emission control signal having a higher frequency than a predetermined vertical synchronization signal; a predetermined number of pixels that each generate a pulse signal by photoelectric conversion; and a counting section that counts the number of the pulse signals in synchronization with each of the light emission control signal and the vertical synchronization signal. Therefore, this brings about an effect that capturing of image data and distance measurement are executed.

Furthermore, in the first aspect, the counting section may include a first counter that counts the pulse signal in synchronization with the light emission control signal, and a second counter that counts the pulse signal in synchronization with the vertical synchronization signal. Therefore, this brings about an effect that distance measurement is executed on the basis of the count value of the counter.

Furthermore, in the first aspect, the counting section may include a first counter that sequentially performs a process of counting the pulse signal in synchronization with the light emission control signal and a process of counting the pulse signal in synchronization with the vertical synchronization signal, and a second counter that counts the pulse signal in synchronization with the vertical synchronization signal. Therefore, this brings about an effect that the number of counters is reduced.

Furthermore, in the first aspect, a pixel array section in which the predetermined number of pixels are arranged may be divided into a plurality of pixel blocks, the counting section may be provided in every pixel block, and the first counter may count a logical sum of the pulse signals from respective pixels in the pixel block. Therefore, this brings about an effect that the distance is measured for every pixel block.

Furthermore, in the first aspect, four of the first counters and five of the second counters may be arranged in every pixel block. Therefore, this brings about an effect that the distance is measured on the basis of four count values.

Furthermore, in the first aspect, eight of the first counters and one of the second counter may be arranged in every pixel block. Therefore, this brings about an effect that a measurable distance range is widened.

Furthermore, in the first aspect, a pixel array section in which the predetermined number of pixels are arranged may be divided into a plurality of pixel blocks, each of the plurality of pixel blocks may be divided into a plurality of areas, the counting section may be provided to correspond to each of the plurality of areas, and the first counter may count a logical sum of the pulse signals from respective pixels in a corresponding area. Therefore, this brings about an effect that the distance is measured from the count value for every area.

Furthermore, in the first aspect, nine of the pixels may be arranged in each of the plurality of areas. Therefore, this brings about an effect that the logical sum of the pulse signals for nine pixels is counted.

Furthermore, in the first aspect, four of the pixels may be arranged in each of the plurality of areas. Therefore, this brings about an effect that the logical sum of the pulse signals for four pixels is counted.

Furthermore, in the first aspect, four areas may be arranged in the pixel block. Therefore, this brings about an effect that the distance is measured from the count value of each of two areas.

Furthermore, in the first aspect, two areas may be arranged in the pixel block. Therefore, this brings about an effect that the distance is measured from the count value of each of four areas.

Furthermore, in the first aspect, the first counter may count the logical sum of respective pulse signals of a set number of pixels among the pixels in the pixel block. Therefore, this brings about an effect that the data size of the count value is changed.

Furthermore, in the first aspect, the counting section may include a predetermined number of counters that sequentially perform a process of counting the pulse signal in synchronization with the light emission control signal and a process of counting the pulse signal in synchronization with the vertical synchronization signal. Therefore, this brings about an effect that the number of counters is reduced.

Furthermore, in the first aspect, the counting section may include nine of the counters. Therefore, this brings about an effect that the distance is measured from nine count values.

Furthermore, in the first aspect, the counting section may include four of the counters. Therefore, this brings about an effect that the distance is measured from four count values.

Furthermore, in the first aspect, the sensing system further includes: a pixel drive section that supplies an enable signal in which each of a plurality of set values is sequentially set as a phase difference from the light emission control signal. The counter may supply the pulse signal in synchronization with the enable signal. Therefore, this brings about an effect that a distance measurement accuracy is improved.

Furthermore, a second aspect of the present technology is a distance measuring system including: a light emitting section that emits irradiation light in synchronization with a light emission control signal having a higher frequency than a predetermined vertical synchronization signal; a predetermined number of pixels that each generate a pulse signal by photoelectric conversion; a counting section that counts the number of the pulse signals in synchronization with each of the light emission control signal and the vertical synchronization signal; and a distance measuring section that measures a distance to an object on the basis of a count value of the counting section. Therefore, this brings about an effect that image data is captured and distance measurement is executed on the basis of the count value.

Furthermore, a third aspect of the present technology is a sensing system including: a light emitting section that emits irradiation light on the basis of a light emission control signal; a plurality of pixels each generating a pulse signal by photoelectric conversion; and a counting section that counts the number of pulse signals of the plurality of pixels. The counting section includes a plurality of counters and an output destination control circuit that is connected between the plurality of pixels and the plurality of counters, receives a plurality of pulse signals output from the plurality of pixels, and distributes the plurality of pulse signals to a plurality of arbitrary counters, the plurality of pixels is provided in a first chip, and the output control circuit and the counting section are provided in a second chip. Therefore, this brings about an effect that capturing of image data and distance measurement are executed in the sensing system having a stacked structure.

BRIEF DESCRIPTION OF DRAWINGS

FIG. 17 is a diagram for explaining an operation of a counter according to the second embodiment of the present technology.

FIG. 20 is a diagram for explaining an operation of a counter according to the third embodiment of the present technology.

FIG. 23 is a diagram for explaining an operation of a counter according to the fourth embodiment of the present technology.

MODE FOR CARRYING OUT THE INVENTION

Hereinafter, modes (hereinafter, referred to as embodiments) for carrying out the present technology will be described. The description will be given in the following order.

1. First embodiment (an example of counting in synchronization with a light emission control signal and a vertical synchronization signal)
2. Second embodiment (an example in which one counter performs counting in synchronization with the light emission control signal and the vertical synchronization signal)
3. Third embodiment (an example in which all counters perform counting in synchronization with the light emission control signal and the vertical synchronization signal)
4. Fourth embodiment (an example in which eight counters perform counting in synchronization with the light emission control signal and the vertical synchronization signal)
5. Fifth embodiment (an example of dividing into a plurality of areas and counting in synchronization with the light emission control signal and the vertical synchronization signal)
6. Sixth embodiment (an example of reducing the number of pixels in an area and counting in synchronization with the light emission control signal and the vertical synchronization signal)
7. Seventh embodiment (an example of reducing the number of areas and counting in synchronization with the light emission control signal and the vertical synchronization signal)
8. Eighth embodiment (an example of switching a phase difference and counting in synchronization with the light emission control signal and the vertical synchronization signal)
9. Ninth embodiment (an example of fixing the phase difference and counting in synchronization with the light emission control signal and the vertical synchronization signal)
10. Tenth embodiment (an example in which the number of pixels to be counted is switched and counted in synchronization with the light emission control signal and the vertical synchronization signal)
11. Application example to mobile body 1. First Embodiment

[Configuration Example of Distance Measuring System]

Figure 1:
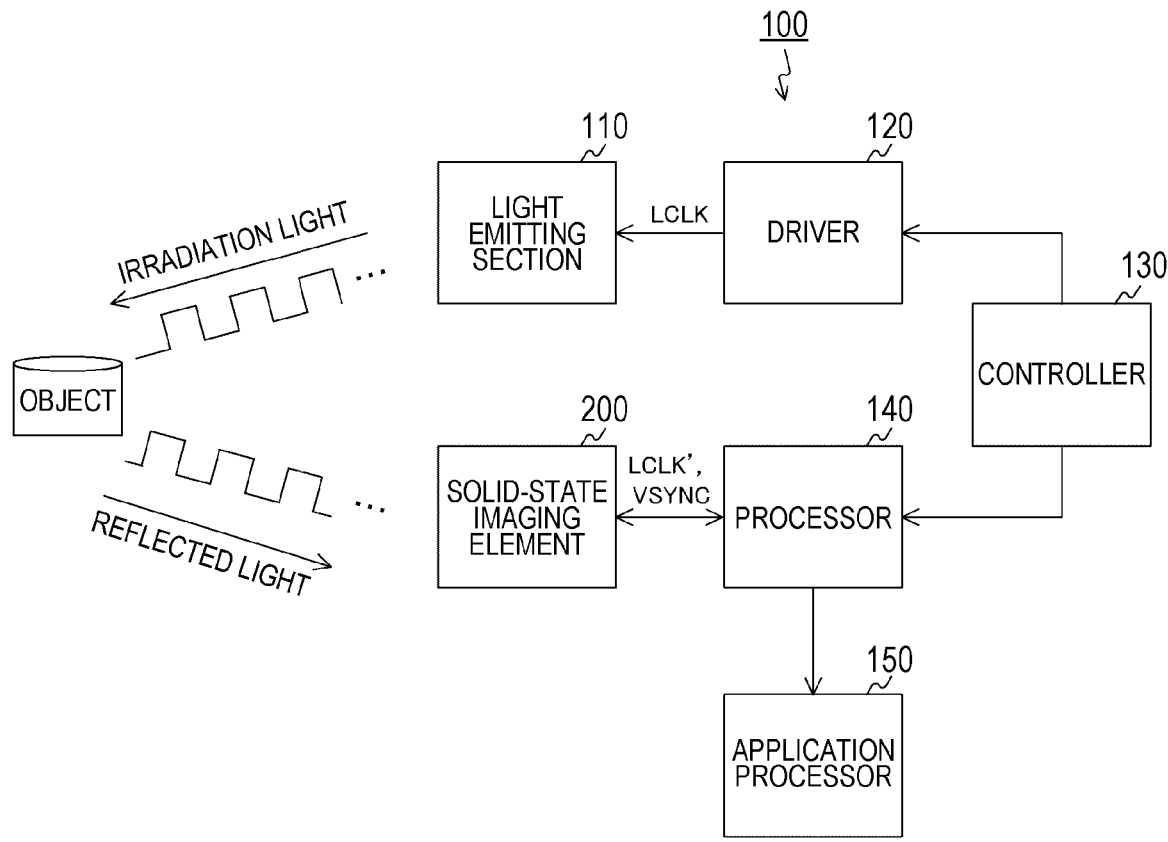
FIG. 1 is a block diagram depicting a configuration example of a distance measuring system according to a first embodiment of the present technology.

FIG. 1 is a block diagram depicting a configuration example of a distance measuring system 100 according to a first embodiment of the present technology. The distance measuring system 100 is configured to capture image data and perform distance measurement. The distance measuring system 100 includes a light emitting section 110, a driver 120, a controller 130, a solid-state imaging element 200, a processor 140, and an application processor 150.

The elements in the distance measuring system 100 may be arranged in one electronic device or may be distributed and arranged in a plurality of devices. In the case of being distributed and arranged in the plurality of devices, for example, the light emitting section 110, the driver 120, the controller 130, the solid-state imaging element 200, and the processor 140 are arranged in an imaging device, and the application processor 150 is arranged in an image processing device.

The light emitting section 110 emits light according to a light emission control signal LCLK from the driver 120 and emits irradiation light. For example, near-infrared light or the like is used as the irradiation light.

The driver 120 generates a predetermined periodic signal as the light emission control signal LCLK under the control of the controller 130 and supplies the signal to the light emitting section 110.

The controller 130 operates the driver 120 and the processor 140 in synchronization with each other. Here, in the distance measuring system, a plurality of modes including a distance measuring mode for measuring a distance to an object and an imaging mode for capturing image data is set. In the distance measuring mode, the controller 130 causes the driver 120 to generate the light emission control signal LCLK, and causes the processor 140 to generate the same signal as the light emission control signal LCLK as a light emission control signal LCLK'. On the other hand, in the imaging mode, the controller 130 stops the driver 120 and causes the processor 140 to generate a vertical synchronization signal VSYNC.

Here, the frequency of the vertical synchronization signal VSYNC is, for example, 30 hertz (Hz) or 60 hertz (Hz). On the other hand, the frequency of the light emission control signal LCLK is higher than that of the vertical synchronization signal VSYNC, and is, for example, 10 to 20 megahertz (MHz).

The processor 140 controls the solid-state imaging element 200 and the application processor 150. The processor 140 generates the light emission control signal LCLK' in the distance measuring mode, supplies the signal to the solid-state imaging element 200, and receives a depth map from the solid-state imaging element 200. On the other hand, in the imaging mode, the processor 140 generates the vertical synchronization signal VSYNC, supplies the signal to the solid-state imaging element 200, and receives image data from the solid-state imaging element 200. Then, the processor 140 supplies the depth map and the image data to the application processor 150.

The application processor 150 performs predetermined processing such as image recognition processing on the basis of the image data and the depth map.

The solid-state imaging element 200 generates image data or a depth map by photoelectric conversion. In the distance measuring mode, the solid-state imaging element 200 photoelectrically converts reflected light with respect to irradiation light in synchronization with the light emission control signal LCLK' to generate a depth map. On the other hand, in the imaging mode, the solid-state imaging element 200 photoelectrically converts the incident light in synchronization with the vertical synchronization signal VSYNC to generate image data. The solid-state imaging element 200 supplies the image data and the depth map to the processor 140. Note that the system including the solid-state imaging element 200 is an example of a sensing system described in the claims.

Note that the solid-state imaging element 200 may have some or all of the functions of the processor 140 and the application processor 150.

[Configuration Example of Solid-State Imaging Element]

Figure 2:
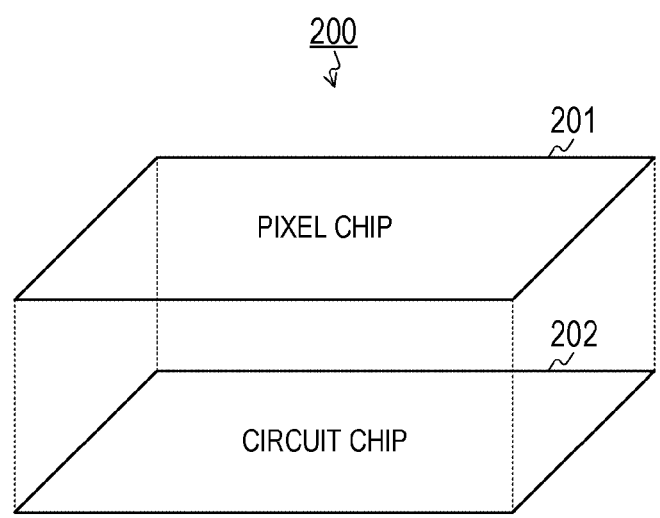
FIG. 2 is a diagram depicting an example of a stacked structure of a solid-state imaging element according to the first embodiment of the present technology.

FIG. 2 is a diagram depicting an example of a stacked structure of the solid-state imaging element 200 according to the first embodiment of the present technology. The solid-state imaging element 200 includes a circuit chip 202 and a pixel chip 201 stacked on the circuit chip 202. These chips are electrically connected via a connection portion such as a via. Note that in addition to the via, the connection can also be made by Cu—Cu bonding or a bump. The connection can also be made by these other methods (such as magnetic coupling). Furthermore, although two chips are stacked, three or more layers can be stacked.

Figure 3:
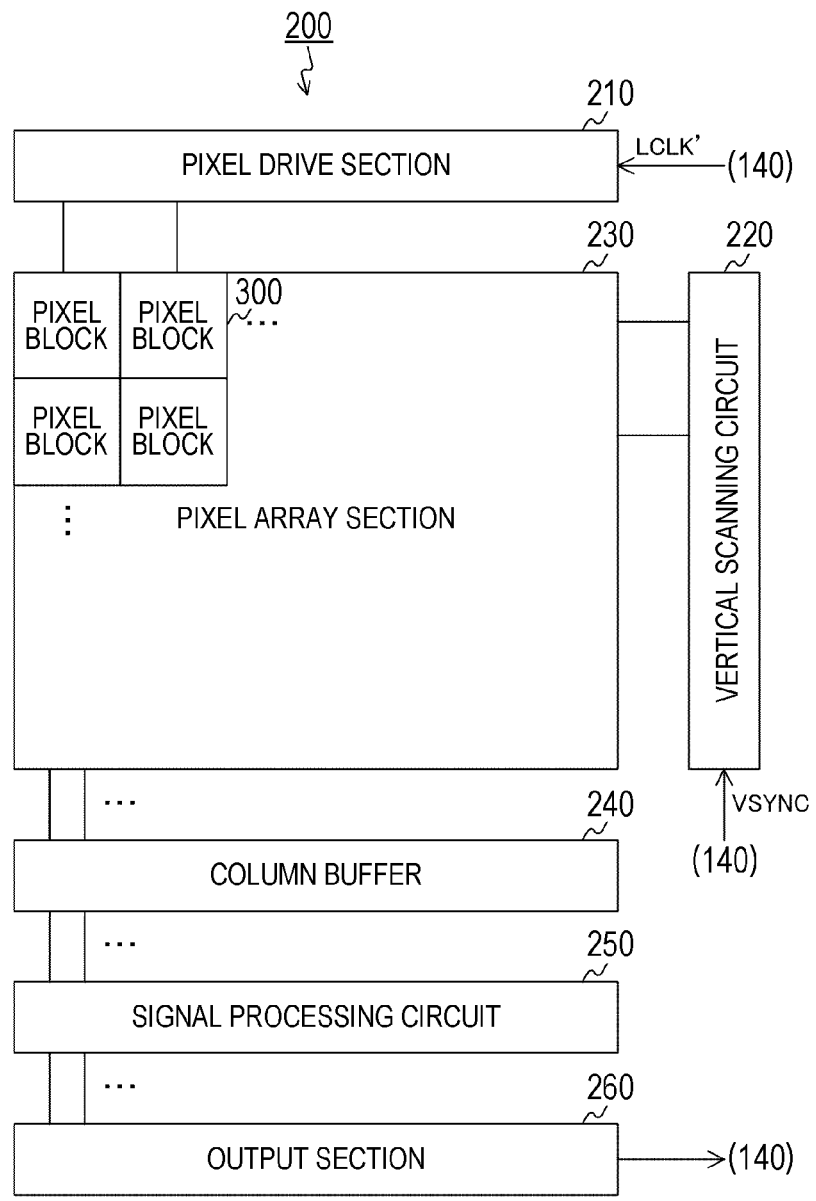
FIG. 3 is a block diagram depicting a configuration example of the solid-state imaging element according to the first embodiment of the present technology.

FIG. 3 is a block diagram depicting a configuration example of the solid-state imaging element 200 according to the first embodiment of the present technology. The solid-state imaging element 200 includes a pixel drive section 210, a vertical scanning circuit 220, a pixel array section 230, a column buffer 240, a signal processing circuit 250, and an output section 260. In the pixel array section 230, a plurality of pixels is arranged in a two-dimensional lattice pattern. Furthermore, the pixel array section 230 is divided into a plurality of pixel blocks 300.

The pixel drive section 210 drives the pixel block in the pixel array section 230 in synchronization with the light emission control signal LCLK' to count the number of pulses.

The vertical scanning circuit 220 sequentially selects rows of pixels in synchronization with the vertical synchronization signal VSYNC, and outputs the count value to the column buffer 240.

The column buffer 240 holds a count value for every pixel.

The signal processing circuit 250 performs predetermined signal processing on data in which count values are arranged. For example, in the distance measuring mode, the signal processing circuit 250 obtains the distance on the basis of the count value for every pixel block 300 and generates a depth map in which the data of the distance is arranged. Furthermore, in the imaging mode, the signal processing circuit 250 generates image data in which the count value for every pixel is arranged as pixel data, and performs various types of image processing on the image data. Then, the signal processing circuit 250 supplies the depth map and the image data to the processor 140.

[Configuration Example of Pixel Block]

Figure 4:
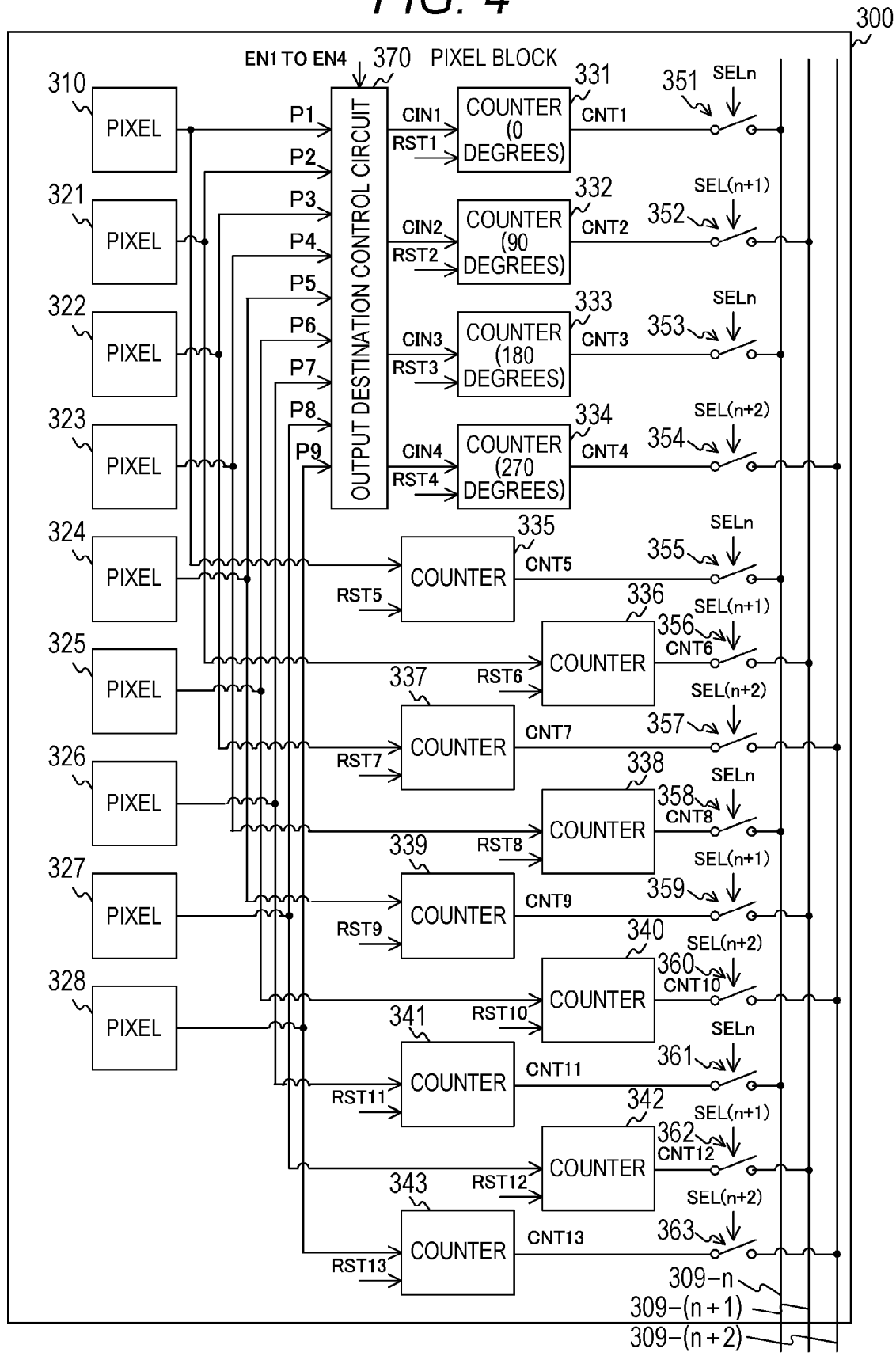
FIG. 4 is a block diagram depicting a configuration example of a pixel block according to the first embodiment of the present technology.

FIG. 4 is a block diagram depicting a configuration example of the pixel block 300 according to the first embodiment of the present technology. The pixel block 300 includes a pixel 310, pixels 321 to 328, an output destination control circuit 370, counters 331 to 343, and switches 351 to 363.

The pixel 310 generates a pulse signal by using the SPAD. The pixel 310 supplies a pulse signal P1 to the output destination control circuit 370 and the counter 335. The configurations of the pixels 321 to 328 are similar to that of the pixel 310. These nine pixels are arranged in, for example, 3 rows×3 columns. Furthermore, in the pixel array section 230, a vertical signal line 309 is wired for every column. A vertical signal line of the n-th (n is an integer) column is defined as 309-n.

The pixel 321 generates a pulse signal P2 and supplies the pulse signal to the output destination control circuit 370 and the counter 336. The pixel 322 generates a pulse signal P3 and supplies the pulse signal to the output destination control circuit 370 and the counter 337. The pixel 323 generates a pulse signal P4 and supplies the pulse signal to the output destination control circuit 370 and the counter 338. The pixel 324 generates a pulse signal P5 and supplies the pulse signal to the output destination control circuit 370 and the counter 339.

Furthermore, the pixel 325 generates a pulse signal P6 and supplies the pulse signal to the output destination control circuit 370 and the counter 340. The pixel 326 generates a pulse signal P7 and supplies the pulse signal to the output destination control circuit 370 and the counter 341. The pixel 327 generates a pulse signal P8 and supplies the pulse signal to the output destination control circuit 370 and the counter 342. The pixel 328 generates a pulse signal P9 and supplies the pulse signal to the output destination control circuit 370 and the counter 343.

The output destination control circuit 370 controls output destinations of the pulse signals P1 to P9. In the distance measuring mode, the output destination control circuit 370 generates a signal of the logical sum of the pulse signals P1 to P9 in synchronization with enable signals EN1 to EN4 from the pixel drive section 210, and inputs the signal to the counters 331 to 334. The signal to the counter 331 is an input signal CIN1, and the signal to the counter 332 is an input signal CIN2. Furthermore, the signal to the counter 333 is an input signal CIN3, and the signal to the counter 334 is an input signal CIN4. On the other hand, in the imaging mode, no signal is output from the output destination control circuit 370 to the counter.

The counter 331 counts the number of the input signals CIN1. Since the input signal CIN1 is the logical sum of the pulse signals of respective pixels in the pixel block 300, the count value thereof indicates the number of photons incident in the pixel block 300. The counter 331 outputs the count value as CNT1 to the switch 351.

The configurations of the counters 332 to 334 are similar to that of the counter 331. The counters 332 to 334 output the count values of the input signals CIN2 to CIN4 to the switches 352 to 354 as CNT2 to CNT4.

The counter 335 counts the number of the pulse signals P1. The counter 335 outputs the count value as CNT5 to the switch 355. The configurations of the counters 336 to 343 are similar to that of the counter 335. The counters 336 to 343 output the count values of the pulse signals P2 to P9 to the switches 356 to 363 as CNT6 to CNT13.

Furthermore, reset signals RST1 to RST13 from the vertical scanning circuit 220 are input to the counters 331 to 343. The count value of the counter is initialized by the reset signal. Note that instead of the vertical scanning circuit 220, the pixel drive section 210 can supply the reset signal.

The switch 351 outputs the count value CNT1 to the column buffer 240 via the vertical signal line 309-*n* according to a selection signal SELn from the vertical scanning circuit 220. The configurations of the switches 352 to 363 are similar to that of the switch 351. For example, the switches 353, 355, 358, and 361 output the count value to the column buffer 240 via the vertical signal line 309-*n* according to the selection signal SELn. For example, the switches 352, 356, 359, and 362 output the count value to the column buffer 240 via the vertical signal line 309-(*n*+1) according to the selection signal SEL(n+1). For example, the switches 354, 357, 360, and 363 output the count value to the column buffer 240 via the vertical signal line 309-(*n*+2) according to the selection signal SEL(n+2).

Note that although nine pixels are arranged in the pixel block 300, the number of pixels in the pixel block 300 is not limited to nine pixels, and may be four pixels or the like as described later. Furthermore, although the counter is provided for every pixel, the counter may be arranged for every column. In this case, the vertical scanning circuit 220 sequentially selects a row, and the counter group counts the pulse signals from the selected row.

[Configuration Example of Pixel]

Figure 5:
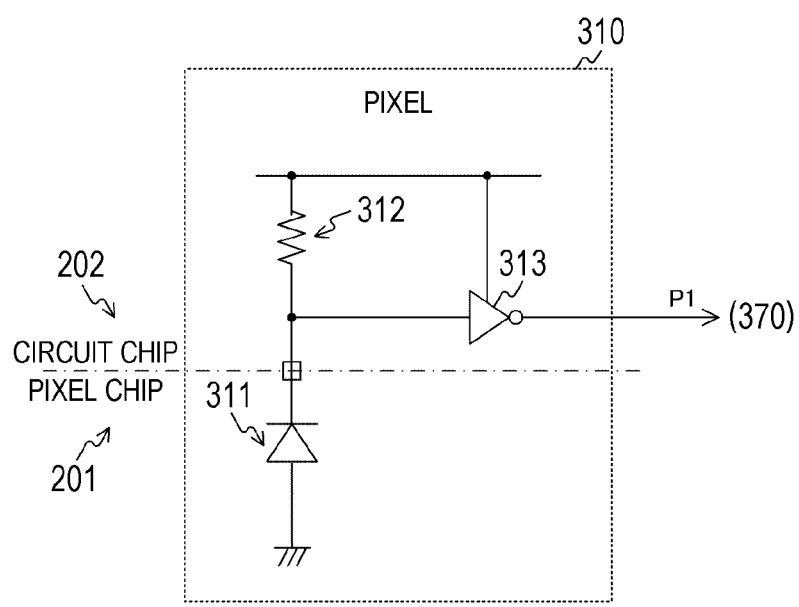
FIG. 5 is a circuit diagram depicting a configuration example of a pixel according to the first embodiment of the present technology.

FIG. 5 is a circuit diagram depicting a configuration example of the pixel 310 according to the first embodiment of the present technology. The pixel 310 includes a SPAD 311, a resistor 312, and an inverter 313.

The SPAD 311 generates a photocurrent by photoelectric conversion and performs avalanche amplification. The resistor 312 and the SPAD 311 are connected in series between a power supply terminal and a ground terminal.

The inverter 313 inverts a potential at the connection point between the resistor 312 and the SPAD 311 and outputs the inverted potential as the pulse signal P1 to the output destination control circuit 370.

Furthermore, for example, the SPAD 311 is provided on the pixel chip 201, and the resistor 312, the inverter 313, and the subsequent circuits (the output destination control circuit 370 and the like) are provided on the circuit chip 202. Note that the entire pixel 310 can also be provided in the pixel chip 201.

Figure 6:
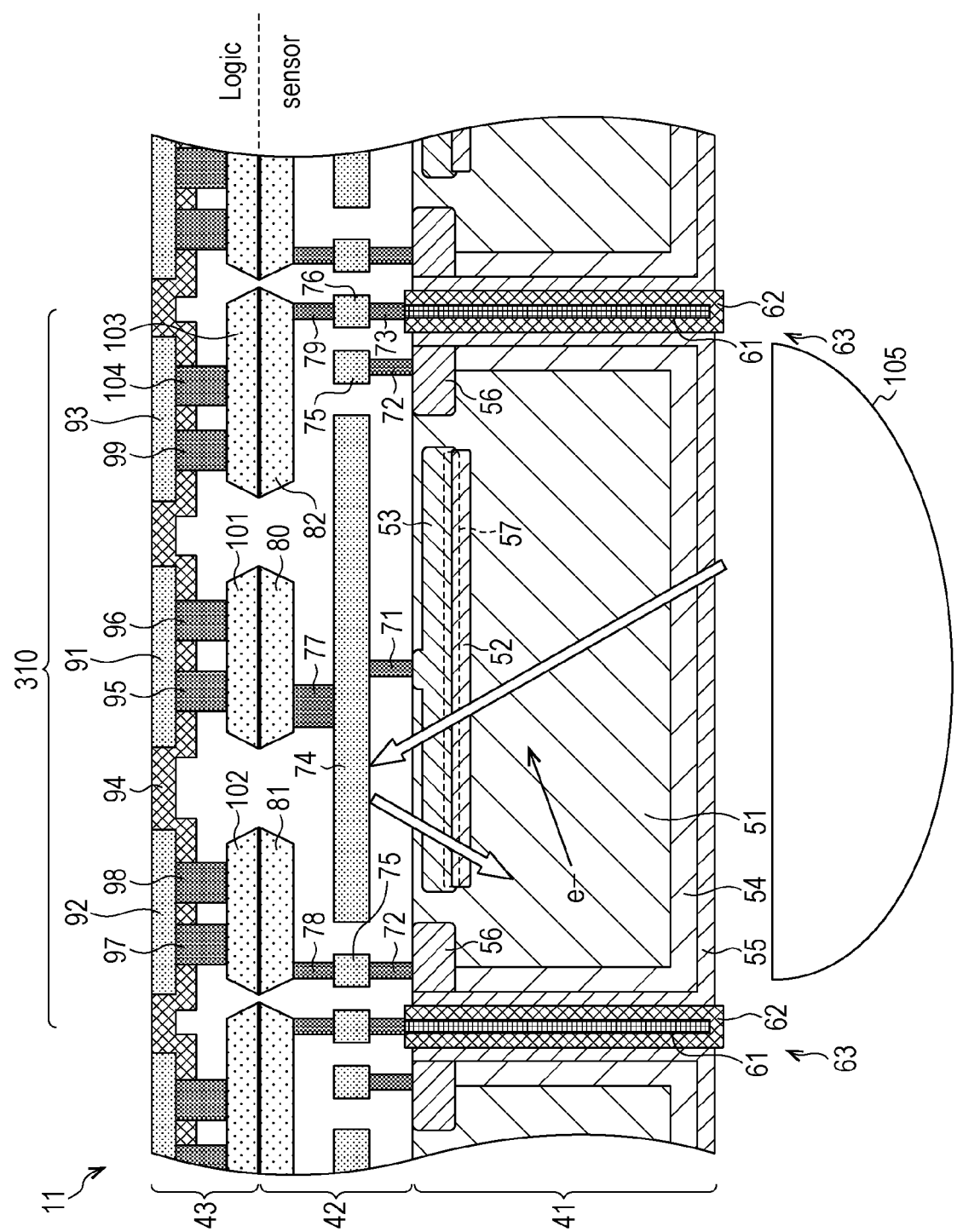
FIG. 6 is a cross-sectional view depicting the configuration example of the pixel according to the first embodiment of the present technology.

FIG. 6 is a cross-sectional view depicting the configuration example of the pixel 310 according to the first embodiment of the present technology. As illustrated in the drawing, the light condensed by a microlens 105 is input to each layer in the pixel 310. The configuration of the region other than the microlens 105 is similar to that described in paragraphs 0024 to 0053 of Japanese Patent Application Laid-Open No. 2018-88488, for example.

[Configuration Example of Output Destination Control Circuit]

Figure 7:
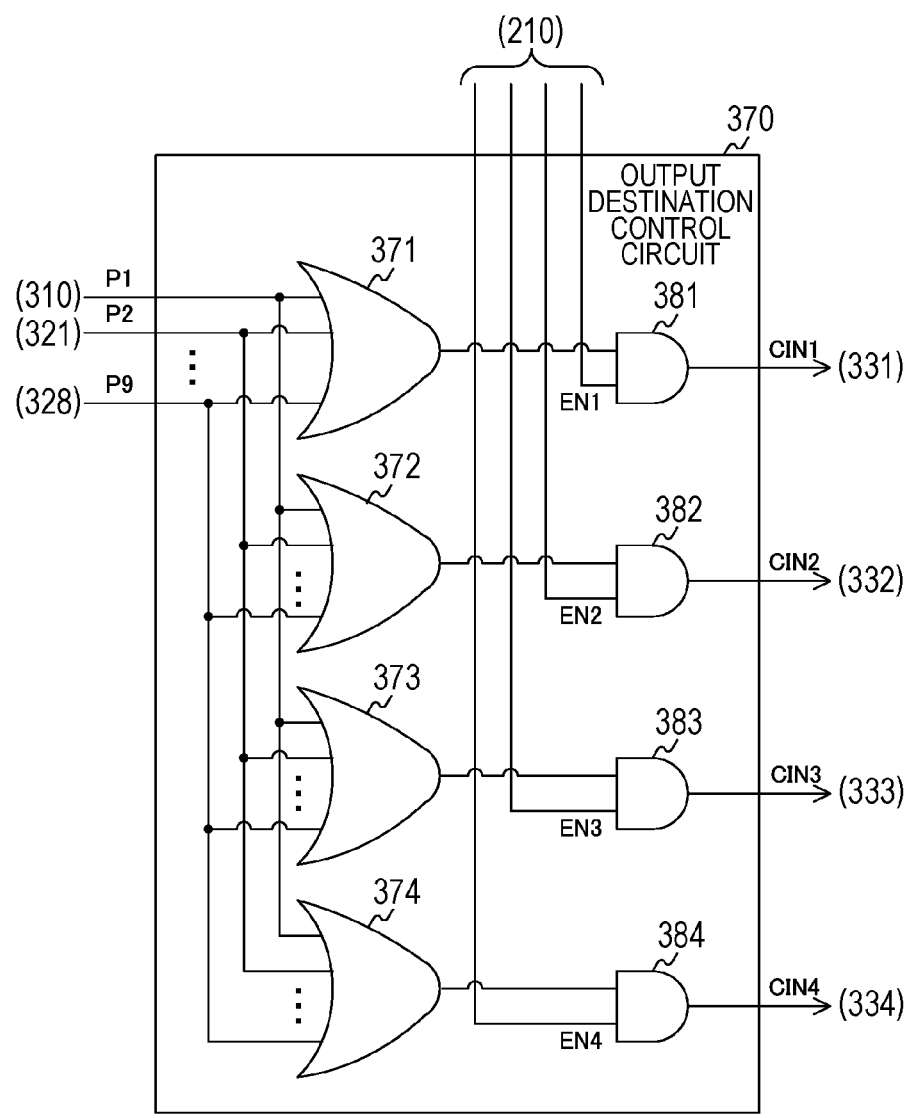
FIG. 7 is a circuit diagram depicting a configuration example of an output destination control circuit according to the first embodiment of the present technology.

FIG. 7 is a circuit diagram depicting a configuration example of the output destination control circuit 370 according to the first embodiment of the present technology. The output destination control circuit 370 includes OR (logical sum) gates 371 to 374 and AND (logical product) gates 381 to 384.

The OR gate 371 outputs the logical sum of the pulse signals P1 to P9 to the AND gate 381. The OR gate 372 outputs the logical sum of the pulse signals P1 to P9 to the AND gate 382. The OR gate 373 outputs the logical sum of the pulse signals P1 to P9 to the AND gate 383. The OR gate 374 outputs the logical sum of the pulse signals P1 to P9 to the AND gate 384. Note that when the pulse signals P1 to P9 are output almost simultaneously, the number of signals after the logical sum of the OR gate 371 becomes one, and the miss count occurs. Therefore, the number of inputs of the OR gate 371 may be reduced to only an even number (P2, P4, or the like), only an odd number (P1, P3, or the like), one-third pixels, or the like by wiring. The similar applies to an OR gate such as the OR gate 372.

The AND gate 381 outputs, to the counter 331, the logical product of the signal from the OR gate 371 and the enable signal EN1 from the pixel drive section 210 as the input signal CIN1. The AND gate 382 outputs, to the counter 332, the logical product of the signal from the OR gate 372 and the enable signal EN2 from the pixel drive section 210 as the input signal CIN2. The AND gate 383 outputs, to the counter 333, the logical product of the signal from the OR gate 373 and the enable signal EN3 from the pixel drive section 210 as the input signal CIN3. The AND gate 384 outputs, to the counter 334, the logical product of the signal from the OR gate 374 and the enable signal EN4 from the pixel drive section 210 as the input signal CIN4.

Here, the enable signal EN1 is the same signal as the light emission control signal LCLK. The enable signal EN2 is a signal obtained by shifting the phase of the light emission control signal LCLK by 90 degrees. The enable signal EN3 is a signal obtained by shifting the phase of the light emission control signal LCLK by 180 degrees. The enable signal EN4 is a signal obtained by shifting the phase of the light emission control signal LCLK by 270 degrees. In other words, the enable signals EN1 to EN4 are signals having phase differences of 0 degrees, 90 degrees, 180 degrees, and 270 degrees from the light emission control signal LCLK.

With the configuration illustrated in the drawing, the counter 331 can count the number of pulses (in other words, the number of photons) in the pixel block 300 in synchronization with the enable signal EN1 having a phase difference of 0 degrees. Furthermore, the counter 332 can count the number of pulses in the pixel block 300 in synchronization with the enable signal EN2 having a phase difference of 90 degrees. The counter 333 can count the number of pulses in the pixel block 300 in synchronization with the enable signal EN3 having a phase difference of 180 degrees. The counter 334 can count the number of pulses in the pixel block 300 in synchronization with the enable signal EN3 having a phase difference of 270 degrees.

The signal processing circuit 250 obtains the distance by the following formula on the basis of the count values CNT1 to CNT4 of the counters 331 to 334, for example.

$$d=(c/4\pi f)\times\tan^{-1}\times\{(\text{CNT2}-\text{CNT4})/(\text{CNT1}-\text{CNT3})\} \quad \text{Formula 1}$$

In the above formula, d is a distance, and the unit is, for example, meter (m). c is the speed of light, and the unit is, for example, meter per second (m/s). $\tan^{-1}$ is an inverse function of a tangent function. The value of (CNT2−CNT4)/(CNT1−CNT3) indicates the phase difference between the irradiation light and the reflected light. n represents a circular constant. Furthermore, f is a frequency of the irradiation light, and the unit is, for example, megahertz (MHz).

As described above, a distance measurement method for calculating the distance on the basis of the flight time of light is called a time of flight (ToF) method.

Figure 8:
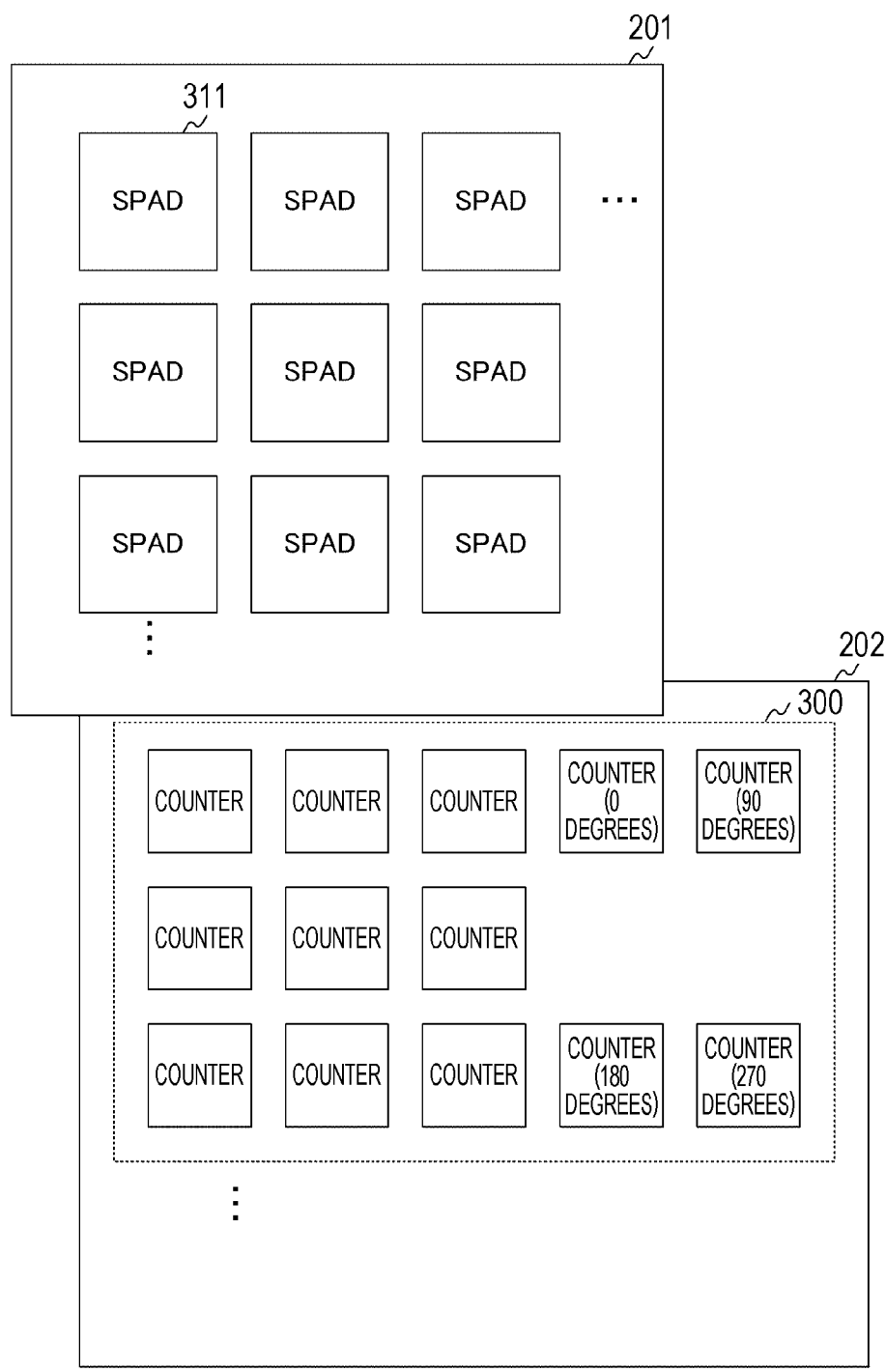
FIG. 8 is a diagram depicting an example of a correspondence relationship between circuits provided in a pixel chip and circuits provided in a circuit chip according to the first embodiment of the present technology.

FIG. 8 is a diagram depicting an example of a correspondence relationship between circuits provided in the pixel chip 201 and circuits provided in the circuit chip 202 according to the first embodiment of the present technology. As illustrated in the drawing, for every pixel block 300, SPADs for nine pixels are arranged in the pixel chip 201. Furthermore, for every pixel block 300, thirteen counters are arranged in the circuit chip 202. Note that, in the drawing, circuits (such as the output destination control circuit 370) other than the counter in the circuit chip 202 are omitted.

Four of the thirteen counters count the number of pulses in the pixel block 300 in synchronization with the enable signals having the phase differences of 0 degrees, 90 degrees, 180 degrees, and 270 degrees. In the drawing, the value in parentheses at the bottom of the counter indicates the phase difference of the corresponding enable signal. The remaining nine counters count the number of pulses of one corresponding pixel in synchronization with the vertical synchronization signal VSYNC.

Figures 9, 10:
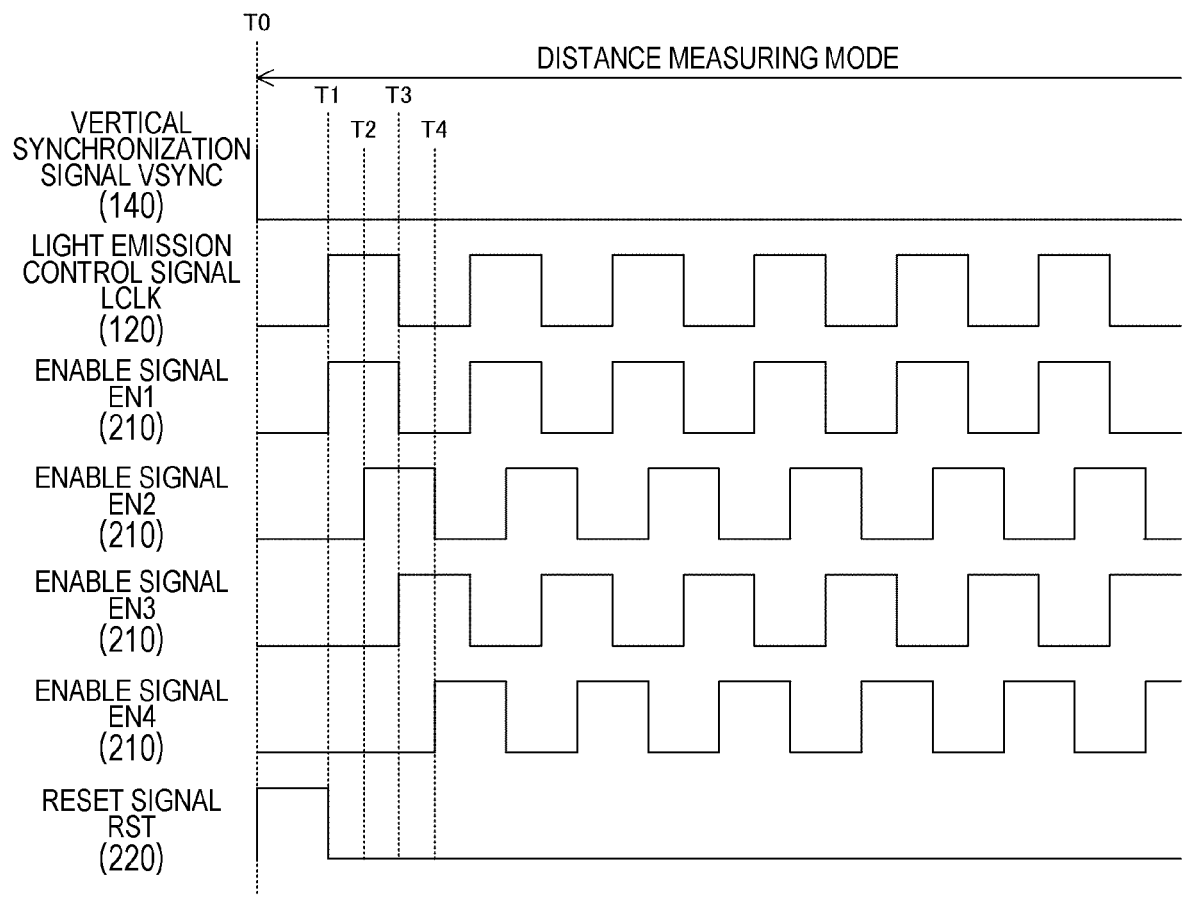
FIG. 9 is a diagram for explaining an operation of a counter according to the first embodiment of the present technology.
FIG. 10 is a timing chart illustrating an example of an operation of the solid-state imaging element in a distance measuring mode according to the first embodiment of the present technology.

FIG. 9 is a diagram for explaining the operation of the counter according to the first embodiment of the present technology. Counters #1 to #4 in the drawing indicate the counters 331 to 334, respectively. The counters #5 to #13 indicate the counters 335 to 343.

In the distance measuring mode, the counters #1 to #4 count the number of pulses in the pixel block 300 in synchronization with the enable signals EN1 to EN4 having the phase differences of 0 degrees, 90 degrees, 180 degrees, and 270 degrees. On the other hand, the counters #5 to #13 stop counting.

In the imaging mode, the counters #5 to #13 count the number of pulses of the corresponding pixel in synchronization with the vertical synchronization signal VSYNC. On the other hand, the counters #1 to #4 stop counting.

[Operation Example of Solid-State Imaging Element]

FIG. 10 is a timing chart illustrating an example of the operation of the solid-state imaging element 200 in the distance measuring mode according to the first embodiment of the present technology. It is assumed that the distance measuring mode is set at timing T0. The processor 140 stops the supply of the vertical synchronization signal VSYNC. The vertical scanning circuit 220 supplies reset signals RST to the counters 331 to 334 to initialize the count values.

Furthermore, at timing T1, the driver 120 starts supplying the light emission control signal LCLK, and the light emitting section 110 emits light in synchronization with the signal. Furthermore, at the timing T1, the pixel drive section 210 starts supplying the enable signal EN1 having a phase difference of 0 degrees from the light emission control signal LCLK. Then, at timing T2, the pixel drive section 210 starts supplying the enable signal EN2 having a phase difference of 90 degrees. At timing T3, the pixel drive section 210 starts supplying the enable signal EN3 having a phase difference of 180 degrees. At timing T4, the pixel drive section 210 starts supplying the enable signal EN4 having a phase difference of 270 degrees.

Then, when a certain period has elapsed, the vertical scanning circuit 220 outputs the count values by the selection signal. On the basis of these count values, the signal processing circuit 250 obtains the distance for every pixel block 300 using Formula 1.

Figure 11:
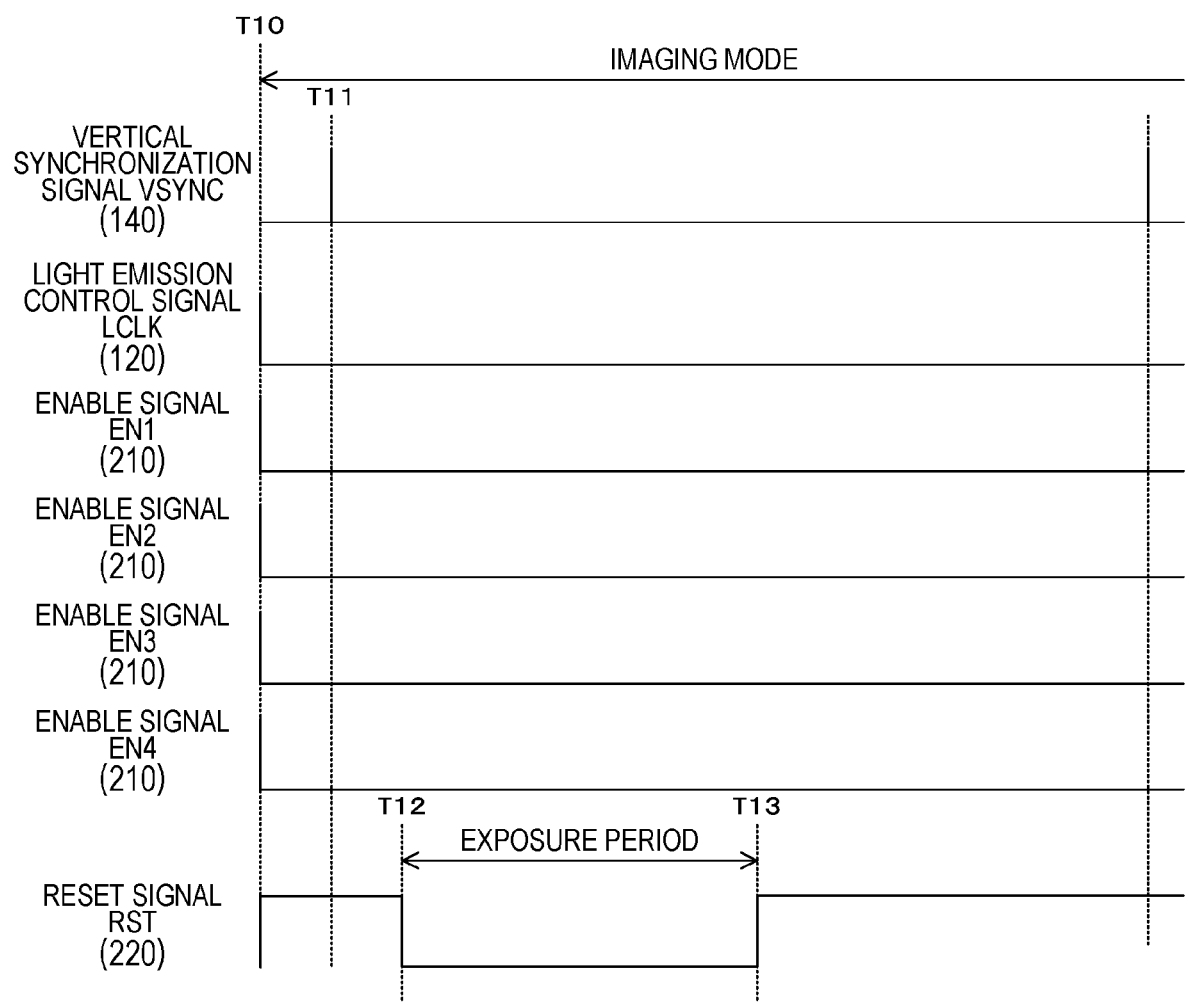
FIG. 11 is a timing chart illustrating an example of an operation of the solid-state imaging element in an imaging mode according to the first embodiment of the present technology.

FIG. 11 is a timing chart illustrating an example of the operation of the solid-state imaging element 200 in the imaging mode according to the first embodiment of the present technology. It is assumed that the imaging mode is set at timing T10. The processor 140 starts supplying the vertical synchronization signal VSYNC at and after timing T11.

Furthermore, the driver 120 stops supplying the light emission control signal LCLK, and the pixel drive section 210 stops supplying the enable signals EN1 to EN4. The vertical scanning circuit 220 supplies the reset signals RST to the counters 335 to 343 to initialize the count values. Then, in the exposure period of timings T12 to T13 synchronized with the vertical synchronization signal VSYNC, the vertical scanning circuit 220 stops supplying the reset signal RST. Within this period, the counters 335 to 343 count the number of pulses, and the vertical scanning circuit 220 outputs the count values by the selection signal. The signal processing circuit 250 generates image data in which these count values are arranged.

Figure 12:
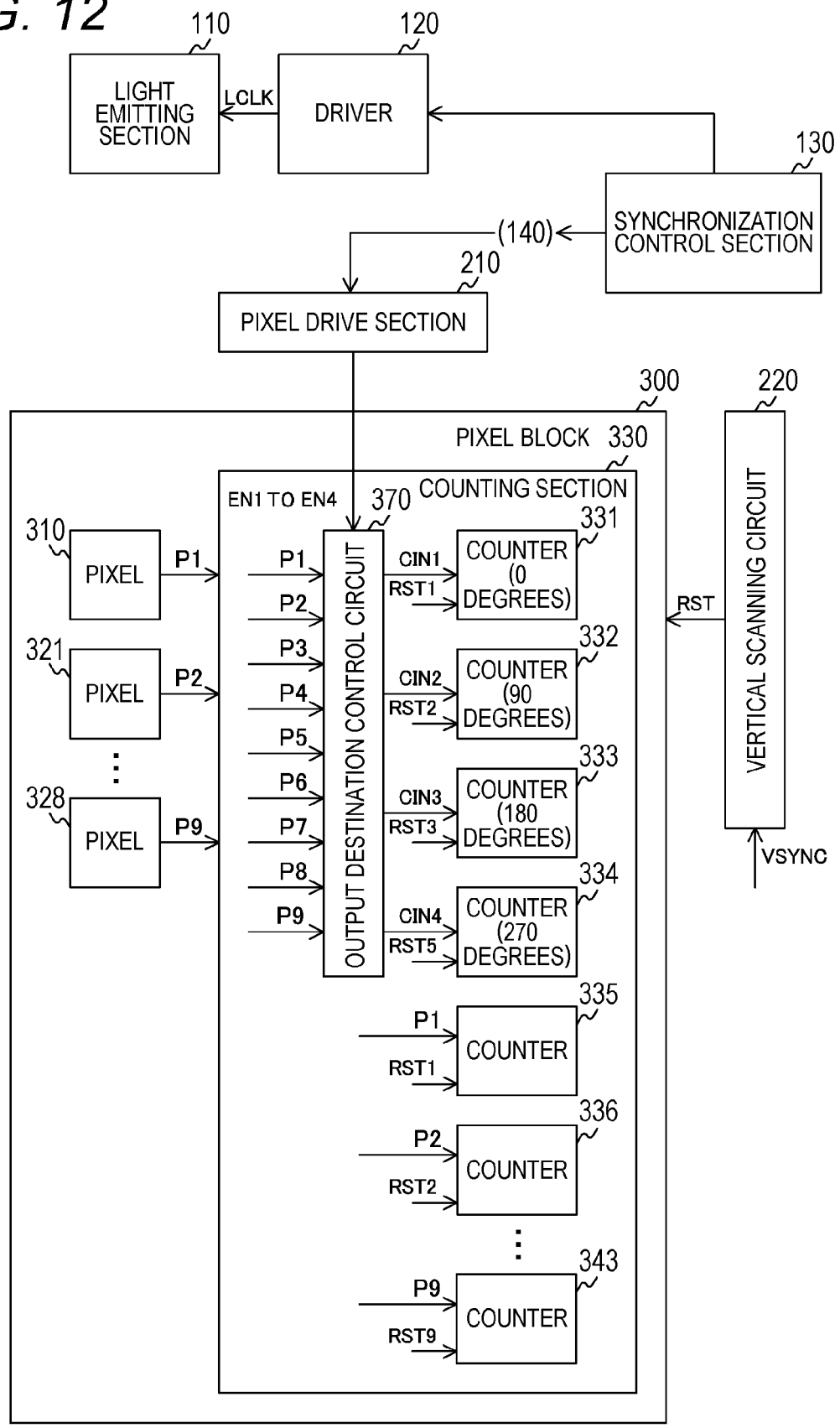
FIG. 12 is an example of an overall diagram of the distance measuring system according to the first embodiment of the present technology.

FIG. 12 is an example of an overall diagram of the distance measuring system 100 according to the first embodiment of the present technology. In the pixel block 300, circuits other than the pixel 310 and the pixels 321 to 328 are arranged in a counting section 330.

The light emitting section 110 emits irradiation light in synchronization with the light emission control signal LCLK having a higher frequency than the vertical synchronization signal VSYNC. Furthermore, each of the pixels such as the pixel 310 generates a pulse signal by photoelectric conversion.

In the distance measuring mode, the output destination control circuit 370 supplies the logical sum of the pulse signals in the pixel block 300 to the counters 331 to 334 in synchronization with the enable signals EN1 to EN4. The counters 331 to 334 count the signals of the logical sum. Since the enable signal is a signal having a phase difference of a predetermined value (0 degrees or 90 degrees) from the light emission control signal LCLK as described above, the count values of the counters 331 to 334 are values obtained by counting the number of pulses in synchronization with the light emission control signal LCLK. Note that the counters 331 to 334 are an example of a first counter described in the claims.

On the other hand, in the imaging mode, the counters 335 to 343 count the number of pulse signals of the corresponding pixels in synchronization with the vertical synchronization signal VSYNC. Note that the counters 335 to 343 are an example of a second counter described in the claims.

As illustrated in the drawing, the counting section 330 is provided with the counters 335 to 343 that perform counting in synchronization with the vertical synchronization signal VSYNC and the counters 331 to 334 that perform counting in synchronization with the light emission control signal LCLK. Therefore, the solid-state imaging element 200 can perform distance measurement by the ToF method in addition to the capturing of image data. Furthermore, since the solid-state imaging element 200 itself can perform distance measurement, it is not necessary to add a distance measuring sensor using infrared rays or lasers. Therefore, it is possible to suppress power consumption and cost of the distance measuring system 100 as compared with a case where a distance measuring sensor is separately added.

Figure 13:
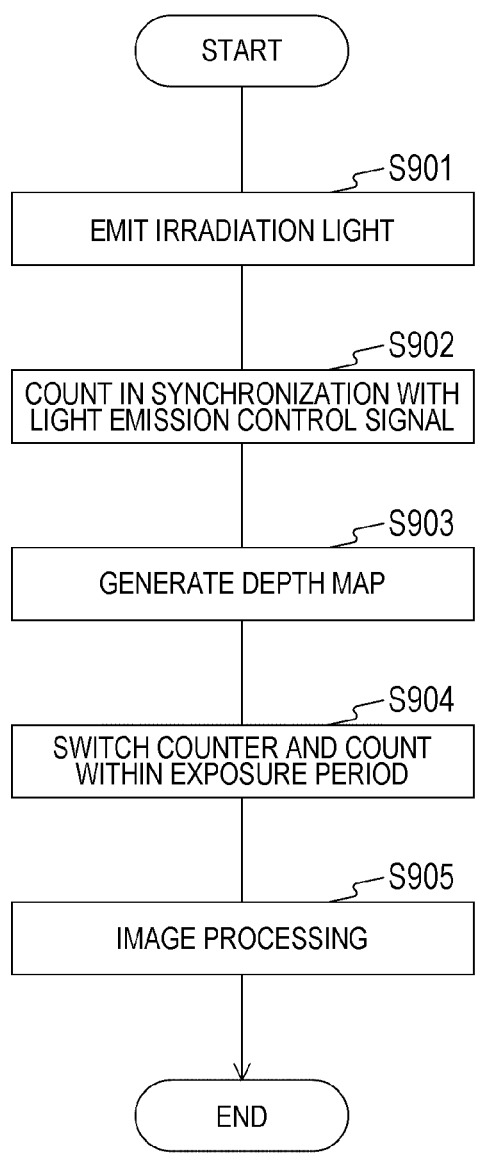
FIG. 13 is a flowchart illustrating an example of an operation of the distance measuring system according to the first embodiment of the present technology.

FIG. 13 is a flowchart illustrating an example of the operation of the distance measuring system 100 according to the first embodiment of the present technology. This operation is started, for example, when an application for performing distance measurement and imaging is executed.

The distance measuring system 100 transitions to the distance measuring mode, and the light emitting section 110 emits irradiation light in synchronization with the light emission control signal LCLK (step S901). Furthermore, the counters 331 to 334 count the number of pulses in synchronization with the light emission control signal LCLK (step S902). Then, the signal processing circuit 250 performs distance measurement on the basis of the count value and generates a depth map (step S903).

Subsequently, the distance measuring system 100 transitions to the imaging mode, and the solid-state imaging element 200 switches to the counters 335 to 343 and counts the number of pulses within the exposure period synchronized with the vertical synchronization signal (step S904). The signal processing circuit 250 performs image processing such as face recognition on the basis of the image data in which the count values are arranged (step S905). After step S905, the distance measuring system 100 ends the operation.

Note that the solid-state imaging element 200 performs imaging (step S904) after distance measurement (step S903), but may perform distance measurement after imaging. Furthermore, the distance measurement and the imaging can be executed simultaneously.

As described above, according to the first embodiment of the present technology, the counting section 330 counts the number of pulses in synchronization with each of the light emission control signal and the vertical synchronization signal, and thus it is possible to perform distance measurement while capturing image data in synchronization with the vertical synchronization signal in the pixel.

2. Second Embodiment

In the first embodiment described above, the counters 331 to 334 for distance measurement and the counters 335 to 343 for imaging are provided for every nine pixels, but the number of necessary counters increases when the number of pixels increases, and the circuit scale increases. The solid-state imaging element 200 of a second embodiment is different from that of the first embodiment in that a part of counters for imaging is also used for distance measurement to reduce the number of counters.

Figure 14:
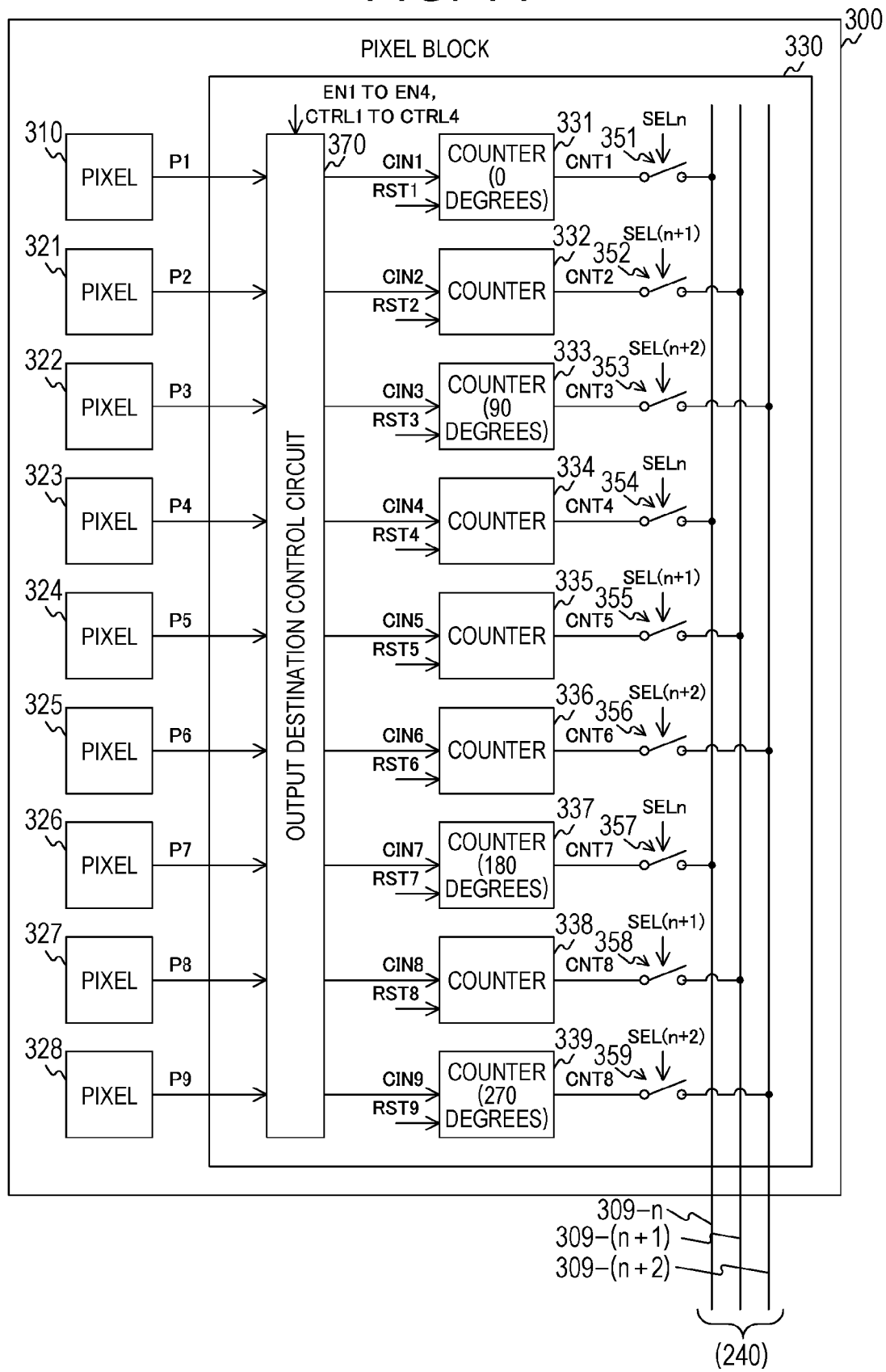
FIG. 14 is a block diagram depicting a configuration example of a pixel block according to a second embodiment of the present technology.

FIG. 14 is a block diagram depicting a configuration example of the pixel block 300 according to the second embodiment of the present technology. The pixel block 300 of the second embodiment is different from that of the first embodiment in that the counters 340 to 343 and the switches 360 to 363 are not provided.

Furthermore, the output destination control circuit 370 of the second embodiment supplies the input signals CIN1 to CIN9 to the counters 331 to 339. Furthermore, the switches 351, 354, and 357 output the count values via the vertical signal line 309-$n$. The switches 352, 355, and 358 output the count value via the vertical signal line 309-$(n+1)$. The switches 353, 356, and 359 output the count value via the vertical signal line 309-$(n+2)$.

Figure 15:
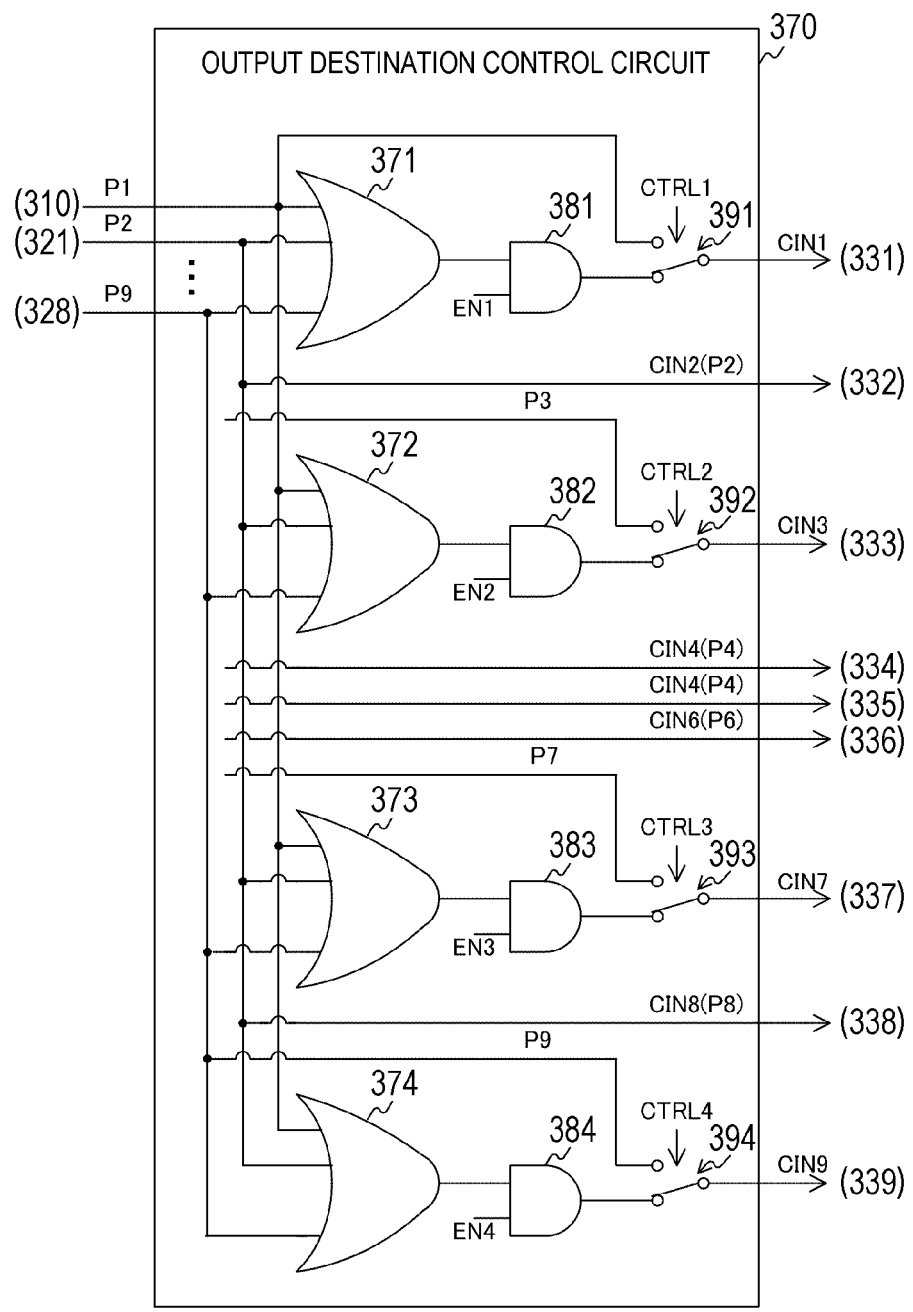
FIG. 15 is a circuit diagram depicting a configuration example of an output destination control circuit according to the second embodiment of the present technology.

FIG. 15 is a circuit diagram depicting a configuration example of the output destination control circuit 370 according to the second embodiment of the present technology. The output destination control circuit 370 of the second embodiment is different from that of the first embodiment in that selectors 391 to 394 are further included.

Furthermore, the AND gate 381 of the second embodiment supplies the logical product to the selector 391, and the AND gate 382 supplies the logical product to the selector 392. The AND gate 383 supplies the logical product to the selector 393, and the AND gate 384 supplies the logical product to the selector 394.

The selector 391 selects one of the pulse signal P1 and the signal from the AND gate 381 according to a control signal CTRL1 and supplies, to the counter 331, the selected signal as the input signal CIN1.

Furthermore, the pulse signal P2 is directly input as the input signal CIN2 to the counter 332.

The selector 392 selects one of the pulse signal P3 and the signal from the AND gate 382 according to a control signal CTRL2 and supplies, to the counter 333, the selected signal as the input signal CIN3.

Furthermore, the pulse signal P4 is directly input as the input signal CIN4 to the counter 334. The pulse signals P5 and P6 are directly input as the input signals CIN5 and CIN6 to the counters 335 and 336.

The selector 393 selects one of the pulse signal P7 and the signal from the AND gate 383 according to a control signal CTRL3 and supplies, to the counter 337, the selected signal as the input signal CIN7.

Furthermore, the pulse signal P8 is directly input as the input signal CIN8 to the counter 338.

The selector 394 selects one of the pulse signal P9 and the signal from the AND gate 384 according to a control signal CTRL4 and supplies, to the counter 339, the selected signal as the input signal CIN9.

The above-described control signals CTRL1 to CTRL4 are supplied from, for example, the pixel drive section 210. In the distance measuring mode, the pixel drive section 210 controls the selectors 391 to 394 by the control signals CTRL1 to CTRL4 to select the signals from the AND gates 381 to 384. Therefore, the counters 331, 333, 337, and 339 can count the number of pulses in synchronization with the enable signals EN1 to EN4 having phase differences of 0 degrees, 90 degrees, 180 degrees, and 270 degrees. Then, the signal processing circuit 250 performs distance measurement on the basis of these count values.

On the other hand, in the imaging mode, the pixel drive section 210 controls the selectors 391 to 394 by the control signals CTRL1 to CTRL4 to select the pulse signals P1, P3, P7, and P9. Therefore, the counters 331, 333, 337, and 339 count the number of pulses of the corresponding pixel in synchronization with the vertical synchronization signal together with the remaining counters.

Figure 16:
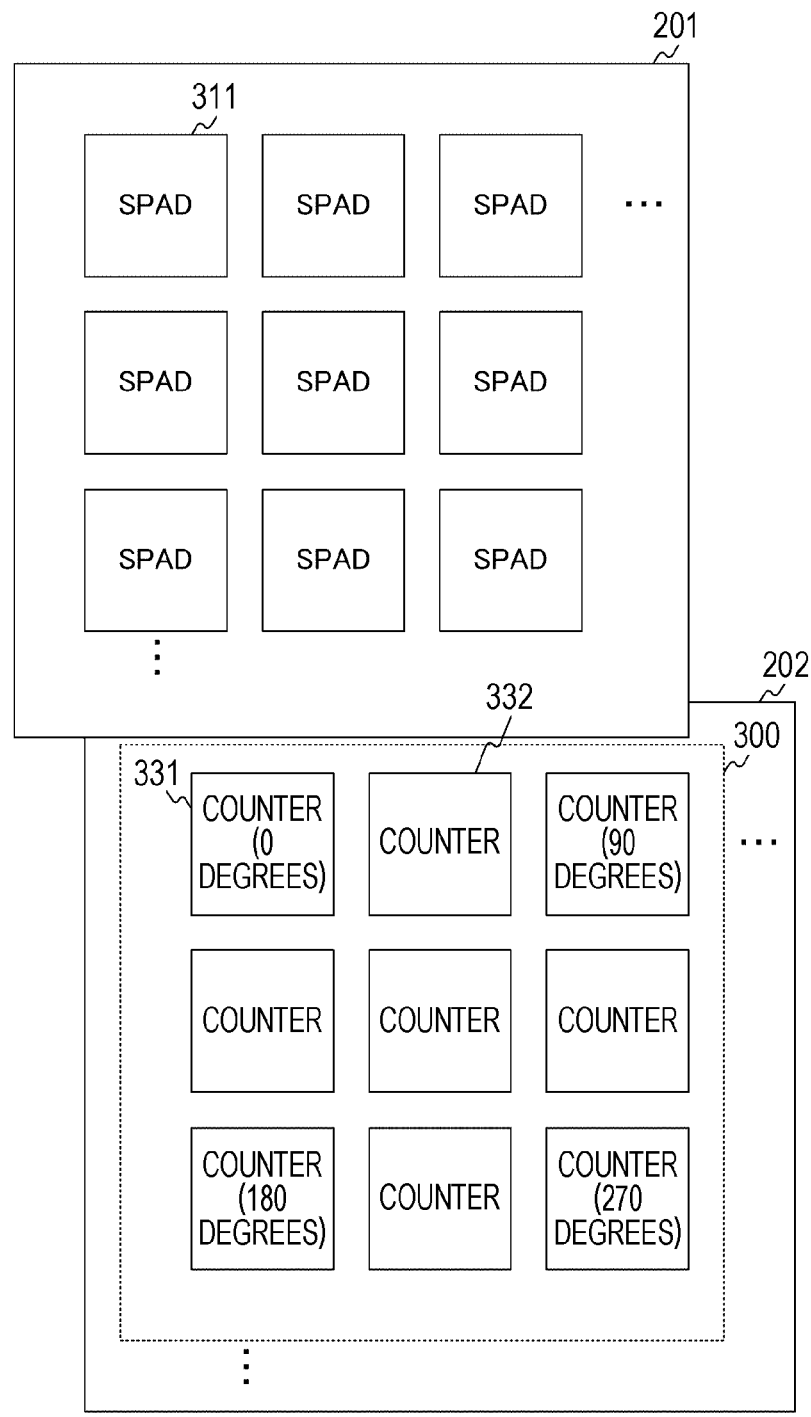
FIG. 16 is a diagram depicting an example of a correspondence relationship between the circuits provided in a pixel chip and circuits provided in a circuit chip according to the second embodiment of the present technology.

FIG. 16 is a diagram depicting an example of a correspondence relationship between the circuits provided in the pixel chip 201 and circuits provided in the circuit chip 202 according to the second embodiment of the present technology. As illustrated in the drawing, for every pixel block 300, SPADs for nine pixels are arranged in the pixel chip 201. Furthermore, for every pixel block 300, nine counters are arranged in the circuit chip 202.

In the distance measuring mode, the upper left, upper right, lower left, and lower right counters among the nine counters count the number of pulses in synchronization with the enable signals EN1 to EN4 having phase differences of 0 degrees, 90 degrees, 180 degrees, and 270 degrees. On the other hand, in the imaging mode, each of the nine counters counts the number of pulses of the corresponding pixel in synchronization with the vertical synchronization signal.

Note that although the four counters used also for distance measurement are arranged at the upper left, the upper right, the lower left, and the lower right, the arrangement is not limited thereto.

FIG. 17 is a diagram for explaining the operation of the counter according to the second embodiment of the present technology. The counters #1 to #9 in the drawing indicate counters 331 to 339, respectively.

In the distance measuring mode, the counters #1, #3, #7, and #9 count the number of pulses in the pixel block 300 in synchronization with the enable signals EN1 to EN4 (in other words, the light emission control signal LCLK) having phase differences of 0 degrees, 90 degrees, 180 degrees, and 270 degrees. On the other hand, the remaining counters stop counting.

In the imaging mode, the counters #1 to 9 count the number of pulses of the corresponding pixel in synchronization with the vertical synchronization signal VSYNC.

As illustrated in the drawing, the counters #1, #3, #7, and #9 sequentially perform a process of counting the number of pulses in the pixel block 300 in synchronization with the light emission control signal LCLK and a process of counting the number of pulses in synchronization with the vertical synchronization signal VSYNC. The remaining counters #2, #4, #5, #6, and #8 count the number of pulses in synchronization with the vertical synchronization signal VSYNC. In other words, four of the nine counters used for imaging are also used for distance measurement. Therefore, the number of counters can be reduced as compared with the first embodiment in which nine counters for imaging and four counters for distance measurement are separately provided.

Note that the counters #1, #3, #7, and #9 are examples of the first counters described in the claims, and the counters #2, #4, #5, #6, and #8 are examples of the second counters described in the claims.

As described above, in the second embodiment of the present technology, the four counters sequentially perform the process of counting the number of pulses in synchronization with the light emission control signal and the process of counting the number of pulses in synchronization with the vertical synchronization signal. Therefore, it is not necessary to separately provide the counter for imaging and the counter for distance measurement, so that the number of counters can be reduced.

3. Third Embodiment

In the second embodiment described above, the four counters count the number of pulses in synchronization with the enable signals having phase differences of 0 degrees to 270 degrees, but in this configuration, the measurable distance range may be insufficient. The solid-state imaging element 200 of a third embodiment is different from that of the second embodiment in that the measurable distance range is expanded by expanding a range of a phase difference.

Figure 18:
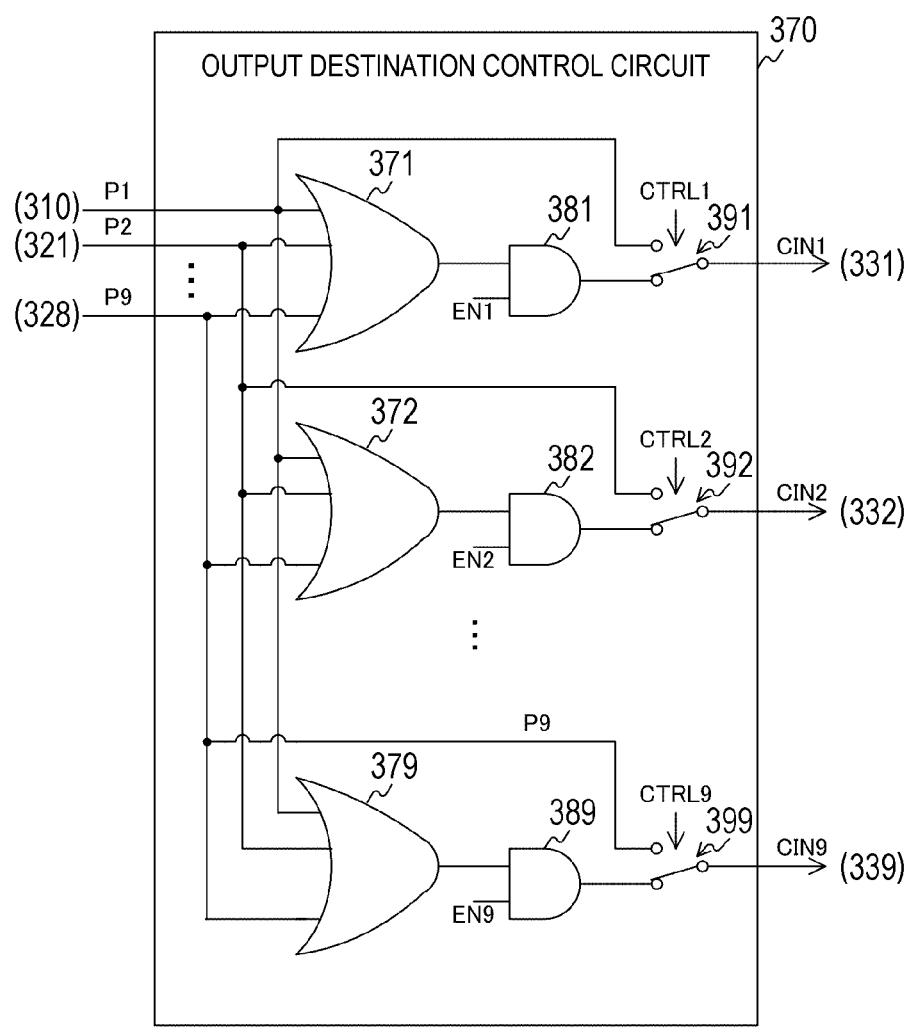
FIG. 18 is a circuit diagram depicting a configuration example of an output destination control circuit according to a third embodiment of the present technology.

FIG. 18 is a circuit diagram depicting a configuration example of the output destination control circuit 370 according to the third embodiment of the present technology. The output destination control circuit 370 of the third embodiment is different from that of the second embodiment in that OR gates 375 to 379, AND gates 385 to 389, and selectors 395 to 399 are further included.

The connection configurations of the OR gates 375 to 379, the AND gates 385 to 389, and the selectors 395 to 399 are similar to those of the OR gate 371, the AND gate 381, and the selector 391.

Enable signals EN5 to EN9 are input to the AND gates 385 to 389. Control signals CTRL5 to CRTRL9 are input to the selectors 395 to 399. Furthermore, the selectors 391 to 399 select one of the pulse signals P1 to P9 and the signals from the AND gates 381 to 389, and supply, to the counters 331 to 339, the selected signals as the input signals CIN1 to CIN9.

The phase differences of the enable signals EN1 to EN9 are set to, for example, 0 degrees, 360 degrees, 90 degrees, 450 degrees, 720 degrees, 630 degrees, 270 degrees, 540 degrees, and 180 degrees, respectively. By setting the phase differences of the enable signal from 0 degrees to 720 degrees, it is possible to expand the distance range that can be measured by the signal processing circuit 250 as compared with the case of 0 degrees to 270 degrees.

In the distance measuring mode, the signal processing circuit 250 obtains a rough distance by, for example, the phase differences of 0 to 720 degrees, and next, obtains an accurate distance by the phase differences of 0 to 540 degrees or the like. By gradually narrowing the range of the phase difference in this manner, the accuracy of the distance can be gradually improved.

Figure 19:
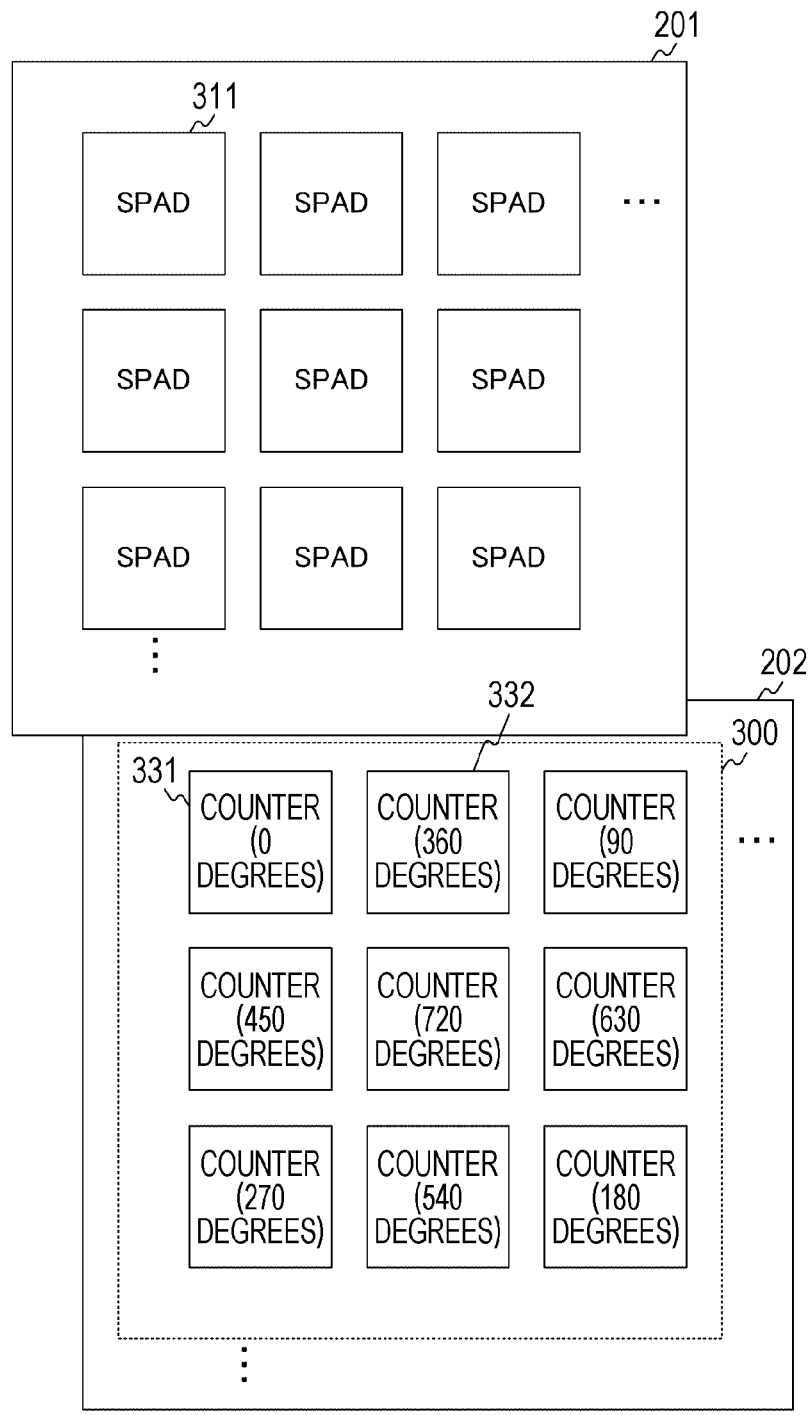
FIG. 19 is a diagram depicting an example of a correspondence relationship between the circuits provided in a pixel chip and circuits provided in a circuit chip according to the third embodiment of the present technology.

FIG. 19 is a diagram depicting an example of a correspondence relationship between the circuits provided in the pixel chip 201 and circuits provided in the circuit chip 202 according to the third embodiment of the present technology. As illustrated in the drawing, for every pixel block 300, SPADs for nine pixels are arranged in the pixel chip 201. Furthermore, for every pixel block 300, nine counters are arranged in the circuit chip 202.

In the distance measuring mode, the upper left, upper right, lower left, and lower right counters among the nine counters count the number of pulses in synchronization with the enable signals having phase differences of 0 degrees, 90 degrees, 180 degrees, and 270 degrees. Furthermore, the central counter counts the number of pulses in synchronization with the enable signal having a phase difference of 720 degrees. The central upper, lower, left, and right counters count the number of pulses in synchronization with the enable signals having phase differences of 360 degrees, 540 degrees, 450 degrees, and 630 degrees.

FIG. 20 is a diagram for explaining the operation of the counter according to the third embodiment of the present technology. In the distance measuring mode, the counters #1 to #9 count the number of pulses in the pixel block 300 in synchronization with the enable signals having phase differences of 0 degrees, 360 degrees, 90 degrees, 450 degrees, 720 degrees, 630 degrees, 270 degrees, 540 degrees, and 180 degrees.

In the imaging mode, the counters #1 to 9 count the number of pulses of the corresponding pixel in synchronization with the vertical synchronization signal VSYNC.

As described above, according to the third embodiment of the present technology, the nine counters count the number of pulses in synchronization with the nine enable signals having different phase differences, and thus it is possible to expand the measurable distance range as compared with the case of counting in synchronization with the four enable signals.

4. Fourth Embodiment

In the above-described third embodiment, the nine counters count the number of pulses in synchronization with the enable signals, but in this configuration, there is a possibility that the number of pieces of data used for distance measurement increases, and the processing amount of the signal processing circuit 250 increases. The solid-state imaging element 200 according to a fourth embodiment is different from that of the third embodiment in that the number of counters used for distance measurement is reduced.

Figure 21:
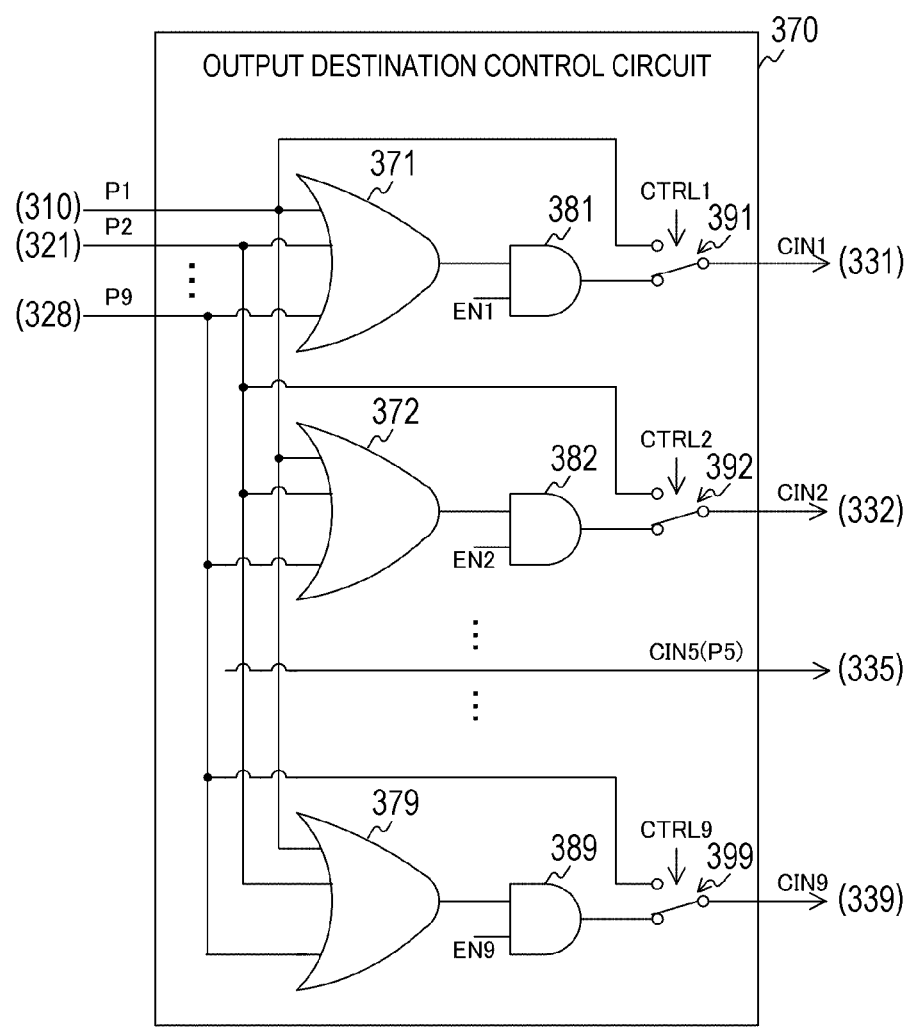
FIG. 21 is a circuit diagram depicting a configuration example of an output destination control circuit according to a fourth embodiment of the present technology.

FIG. 21 is a circuit diagram depicting a configuration example of the output destination control circuit 370 according to the fourth embodiment of the present technology. The output destination control circuit 370 of the fourth embodiment is different from that of the third embodiment in that the OR gate 375, the AND gate 385, and the selector 395 are removed. Furthermore, the pulse signal P5 is directly supplied as the input signal CIN5 to the counter 335.

Figure 22:
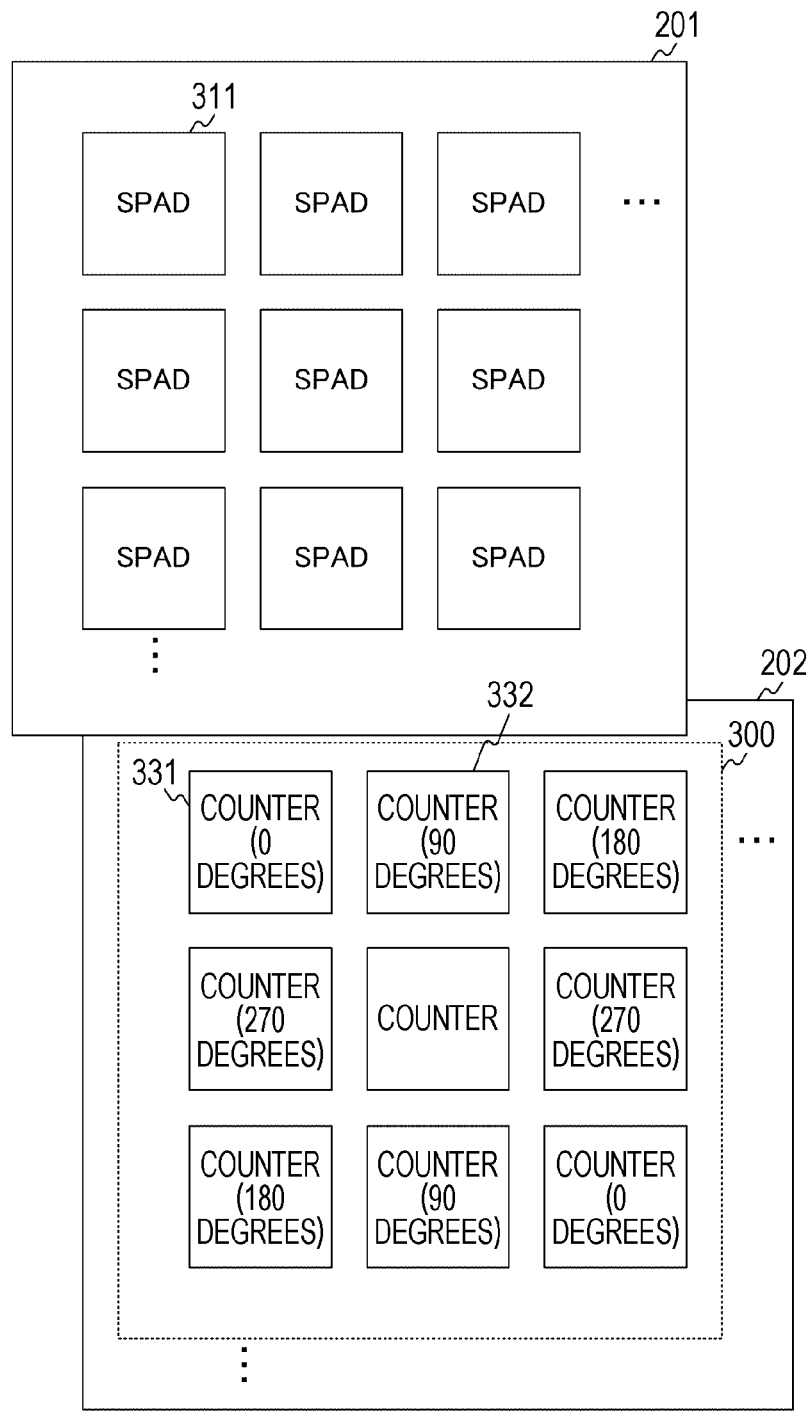
FIG. 22 is a diagram depicting an example of a correspondence relationship between the circuits provided in a pixel chip and circuits provided in a circuit chip according to the fourth embodiment of the present technology.

FIG. 22 is a diagram depicting an example of a correspondence relationship between the circuits provided in the pixel chip 201 and circuits provided in the circuit chip 202 according to the fourth embodiment of the present technology. The pixel block 300 of the fourth embodiment is different from that of the third embodiment in that the central counter does not count in the distance measuring mode.

FIG. 23 is a diagram for explaining the operation of the counter according to the fourth embodiment of the present technology. In the distance measuring mode, eight counters other than the counter #5 count the number of pulses in synchronization with the enable signals. In other words, the number of counters used for distance measurement is reduced from nine to eight. Therefore, the number of pieces of data used for distance measurement is reduced, and the processing amount of the signal processing circuit 250 is reduced. Note that the counter other than the counter #5 is an example of the first counter described in the claims, and the counter #5 is an example of the second counter described in the claims.

As described above, according to the fourth embodiment of the present technology, the eight counters count the number of pulses in synchronization with the enable signals, and thus the number of pieces of data used for distance measurement can be reduced as compared with a case where the nine counters count in synchronization with the enable signals.

5. Fifth Embodiment

In the first embodiment described above, only one counter synchronized with the enable signal having a phase difference of 0 degrees is arranged for every pixel block, but in this configuration, there is a possibility that the quality of the signal from the counter is insufficient. The solid-state imaging element 200 of a fifth embodiment is different from that of the first embodiment in that a signal quality is improved by arranging two or more counters synchronized with the same enable signal.

Figure 24:
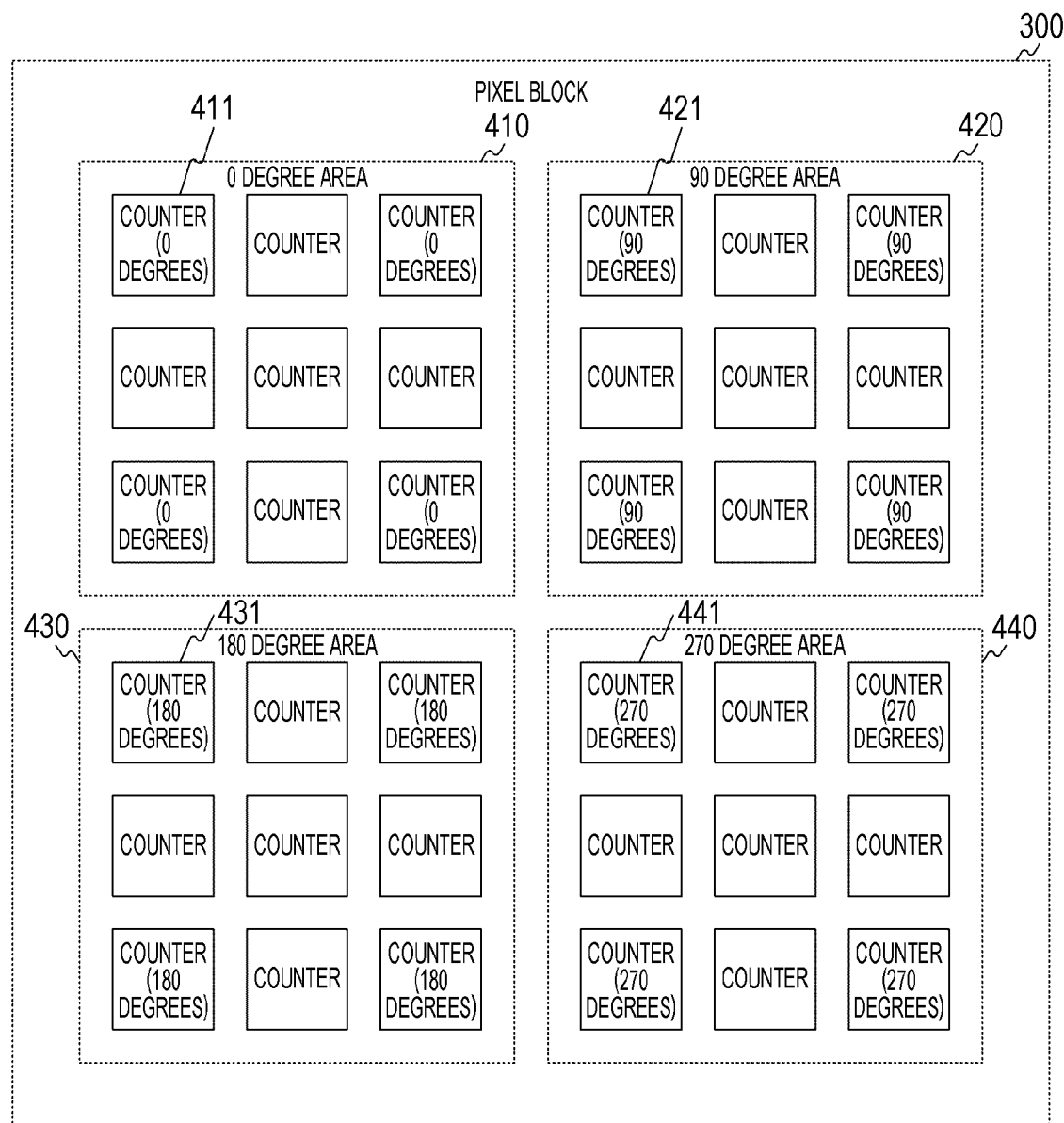
FIG. 24 is a diagram depicting an example of a circuit provided in a pixel block according to a fifth embodiment of the present technology.

FIG. 24 is a diagram depicting an example of a circuit provided in the pixel block 300 according to the fifth embodiment of the present technology. The pixel block 300 is divided into a plurality of areas. For example, the pixel block 300 is divided into a 0 degree area 410, a 90 degree area 420, a 180 degree area 430, and a 270 degree area 440. In the 0 degree area 410, nine counters such as a counter 411 are arranged in 3 rows×3 columns. In the 90 degree area 420, nine counters such as a counter 421 are arranged in 3 rows×3 columns. In the 180 degree area 430, nine counters such as a counter 431 are arranged in 3 rows×3 columns. In the 270 degree area 440, nine counters such as a counter 441 are arranged in 3 rows×3 columns. Note that the number of pixels in every area is the same as the number of counters (that is, nine).

In the 0 degree area 410, the upper left, upper right, lower left, and lower right counters count the number of pulses in the 0 degree area 410 in synchronization with the enable signal having a phase difference of 0 degrees. In the 90 degree area 420, the upper left, upper right, lower left, and lower right counters count the number of pulses in the 90 degree area 420 in synchronization with the enable signal having a phase difference of 90 degrees. In the 180 degree area 430, the upper left, upper right, lower left, and lower right counters count the number of pulses in the 180 degree area 430 in synchronization with the enable signal having a phase difference of 180 degrees. In the 270 degree area 440, the upper left, upper right, lower left, and lower right counters count the number of pulses in the 270 degree area 440 in synchronization with the enable signal having a phase difference of 270 degrees.

Furthermore, the output destination control circuit 370 is arranged in each of the 0 degree area 410, the 90 degree area 420, the 180 degree area 430, and the 270 degree area 440. In the drawing, the output destination control circuit 370 is omitted. Furthermore, the configuration of the output destination control circuit 370 of the fifth embodiment is similar to that of the second embodiment illustrated in FIG. 15. However, the same enable signal is input to four counters.

As illustrated in the drawing, four count values counted in synchronization with the enable signal having the same phase difference are generated for every pixel block 300. The signal processing circuit 250 calculates a total value or an average value of these four count values, and performs distance measurement by using the calculation result. By calculating the sum or average of the four count values, the noise of the signal can be reduced, and the signal quality can be improved.

Note that the counters at the upper left, upper right, lower left, and lower right of each area are an example of the first counter described in the claims, and the other counters are an example of the second counter described in the claims. Furthermore, the number of areas for every pixel block 300 is not limited to four, and the number of pixels for every area is also not limited to nine pixels.

As described above, according to the fifth embodiment of the present technology, the four counters for counting in synchronization with the enable signal having the same phase difference are arranged for every pixel block 300, and thus it is possible to reduce the noise of the signal by calculating the sum or average of the count values of the counters.

6. Sixth Embodiment

In the above-described fifth embodiment, nine pixels are arranged for every area, but in this configuration, there is a possibility that the number of pixels in the pixel block 300 is 36 pixels, and the resolution of the depth map is insufficient. The solid-state imaging element 200 of a sixth embodiment is different from that of the fifth embodiment in that the number of pixels per area is reduced and the resolution of the depth map is improved.

Figure 25:
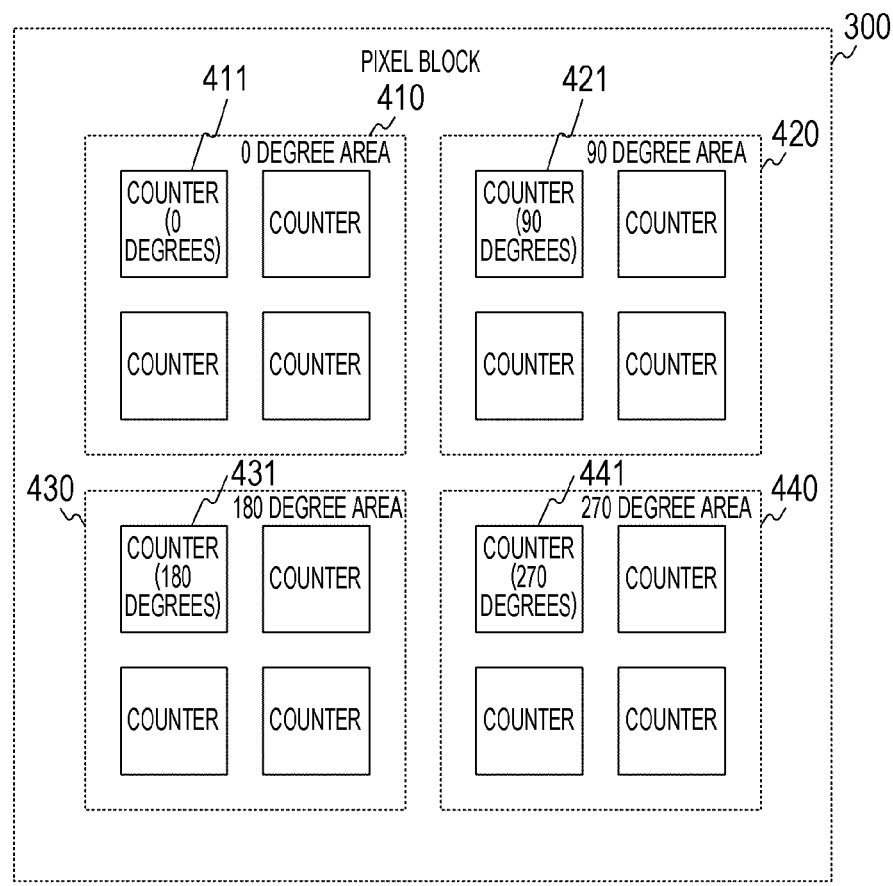
FIG. 25 is a diagram depicting an example of a circuit provided in a pixel block according to a sixth embodiment of the present technology.

FIG. 25 is a diagram depicting an example of a circuit provided in the pixel block 300 according to the sixth embodiment of the present technology. The pixel block 300 of the sixth embodiment is different from that of the fifth embodiment in that the number of pixels per area is four pixels. The four pixels are arranged in 2 rows×2 columns.

Furthermore, a counter for counting the number of pulses in synchronization with an enable signal is arranged at the upper left for every area.

As illustrated in the drawing, the number of pixels per area is reduced to four pixels, and thus the resolution of the depth map can be improved as compared with the fifth embodiment in which the number of pixels per area is nine pixels.

Figure 26:
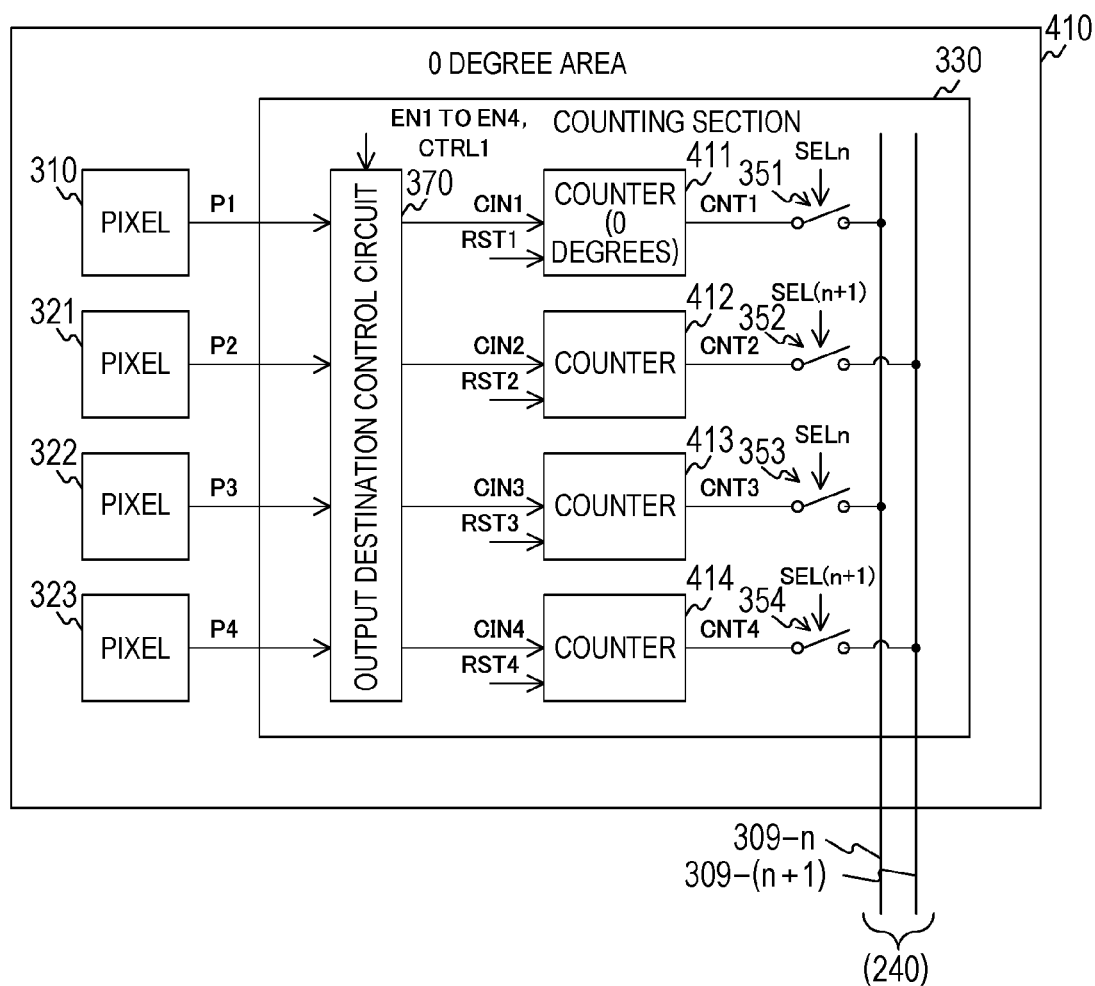
FIG. 26 is a block diagram depicting a configuration example of a 0 degree area in the sixth embodiment of the present technology.

FIG. 26 is a block diagram depicting a configuration example of the 0 degree area 410 according to the sixth embodiment of the present technology. In the 0 degree area 410, the pixels 310 and 321 to 323 and the counting section 330 are arranged. In the counting section 330, the output destination control circuit 370, the counters 411 to 414, and the switches 351 to 354 are arranged.

The pixels 310 and 321 to 323 output the pulse signals P1 to P4 to the output destination control circuit 370. The output destination control circuit 370 supplies the input signals CIN1 to CIN4 to the counters 411 to 414. The counters 411 to 414 supply the count values CNT1 to CNT4 to the switches 351 to 354. The switches 351 and 353 supply count values to the vertical signal line 309-$n$, and the switches 352 and 354 supply count values to the vertical signal line 309-($n$+1).

Note that the configurations of the 90 degree area 420, the 180 degree area 430, and the 270 degree area 440 are similar to those of the 0 degree area 410.

Figure 27:
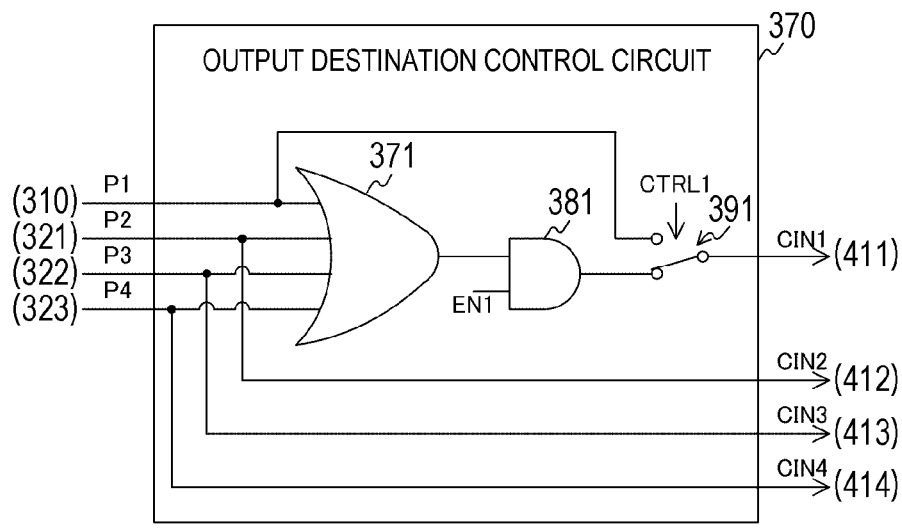
FIG. 27 is a circuit diagram depicting a configuration example of an output destination control circuit according to the sixth embodiment of the present technology.

FIG. 27 is a circuit diagram depicting a configuration example of the output destination control circuit 370 according to the sixth embodiment of the present technology. In the output destination control circuit 370, the OR gate 371, the AND gate 381, and the selector 391 are arranged. The connection configuration of the OR gate 371, the AND gate 381, and the selector 391 of the sixth embodiment is similar to that of FIG. 15 of the second embodiment except that the output destination is the counter 411.

Furthermore, the pulse signals P2 to P4 are directly supplied as the input signals CIN2 to CIN4 to the counters 412 to 414.

Note that the counter 411 is an example of the first counter described in the claims, and the counters 412 to 414 are examples of the second counter described in the claims.

As described above, according to the sixth embodiment of the present technology, the number of pixels per area is reduced to four pixels, and thus the resolution of the depth map can be improved as compared with a case where the number of pixels per area is nine pixels.

7. Seventh Embodiment

In the above-described sixth embodiment, four areas are arranged for every pixel block, but in this configuration, there is a possibility that the number of pixels in the pixel block 300 is sixteen pixels, and the resolution of the depth map is insufficient. The solid-state imaging element 200 of a seventh embodiment is different from that of the sixth embodiment in that the number of areas is reduced and resolution of the depth map is improved.

Figure 28:
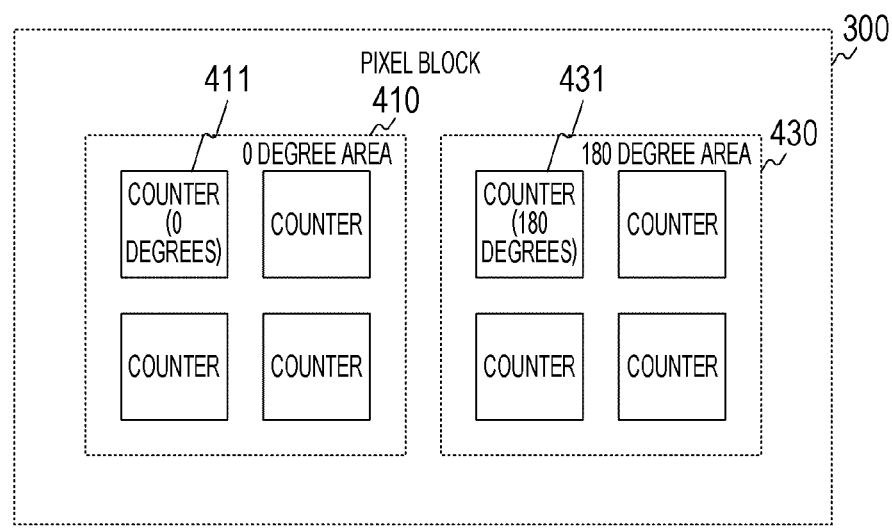
FIG. 28 is a diagram depicting an example of a circuit provided in a pixel block according to a seventh embodiment of the present technology.

FIG. 28 is a diagram depicting an example of a circuit provided in the pixel block according to the seventh embodiment of the present technology. The pixel block 300 of the seventh embodiment is different from that of the sixth embodiment in that the number of areas is two. For example, the 0 degree area 410 and the 180 degree area 430 are provided in the pixel block 300. By reducing the number of areas in the pixel block 300 from four to two, the size of the pixel block 300 can be reduced. Therefore, the resolution of the depth map can be improved.

Figure 29:
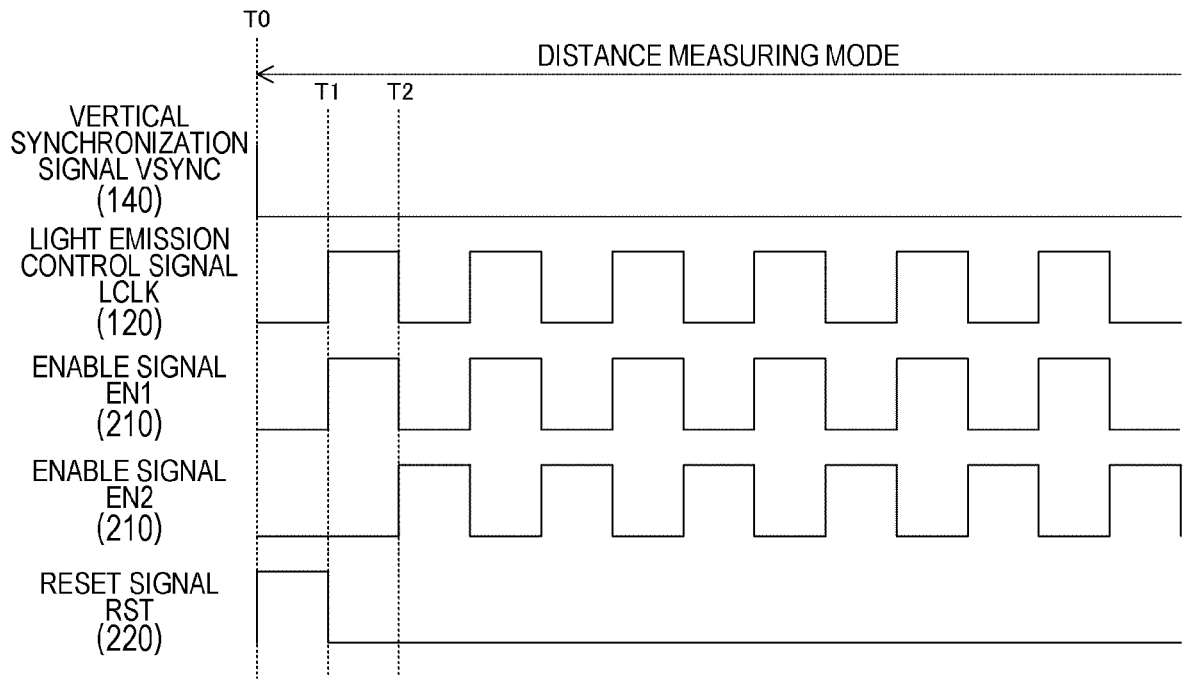
FIG. 29 is a timing chart illustrating an example of an operation of the solid-state imaging element in the distance measuring mode according to the seventh embodiment of the present technology.

FIG. 29 is a timing chart illustrating an example of the operation of the solid-state imaging element 200 in the distance measuring mode according to the seventh embodiment of the present technology. It is assumed that the distance measuring mode is set at timing T0. The processor 140 stops the supply of the vertical synchronization signal VSYNC. The vertical scanning circuit 220 supplies reset signals RST to the counters 331 to 334 to initialize the count values.

Furthermore, at timing T1, the driver 120 starts supplying the light emission control signal LCLK, and the light emitting section 110 emits light in synchronization with the signal. Furthermore, at the timing T1, the pixel drive section 210 starts supplying the enable signal EN1 having a phase difference of 0 degrees from the light emission control signal LCLK. Then, at timing T2, the pixel drive section 210 starts supplying the enable signal EN2 having a phase difference of 180 degrees.

Then, when a certain period has elapsed, the vertical scanning circuit 220 outputs the count values by the selection signal. On the basis of these count values, the signal processing circuit 250 obtains the distance for every pixel block 300.

As described above, according to the seventh embodiment of the present technology, the number of areas for every pixel block 300 is reduced to two, and thus the resolution of the depth map can be improved as compared with a case where the number of areas is four.

8. Eighth Embodiment

In the above-described seventh embodiment, the counters count the number of pulses in synchronization with the enable signals with phase differences of 0 degrees and 180 degrees, but since the enable signals with the phase differences of 90 degrees and 270 degrees are not used, the distance measurement accuracy is reduced, and the measurable distance range is narrowed. The solid-state imaging element 200 of an eighth embodiment is different from that of the seventh embodiment in that the number of pulses is counted in synchronization with the enable signals having phase differences of 90 degrees and 270 degrees in addition to the enable signals having phase differences of 0 degrees and 180 degrees.

Figure 30:
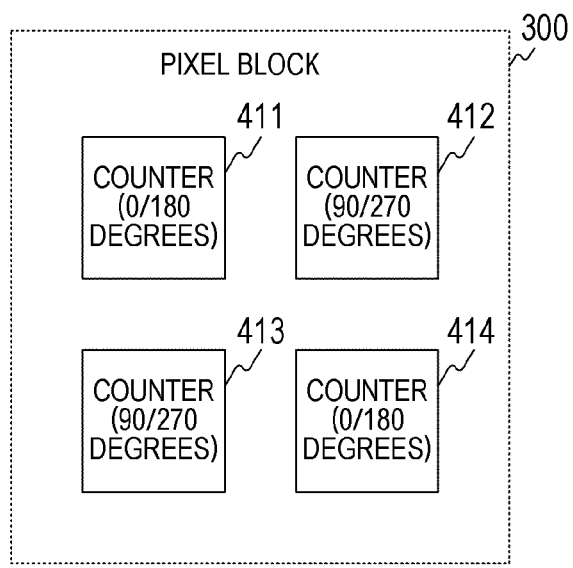
FIG. 30 is a diagram depicting an example of a circuit provided in a pixel block according to an eighth embodiment of the present technology.

FIG. 30 is a diagram depicting an example of a circuit provided in the pixel block 300 according to the eighth embodiment of the present technology. The pixel block 300 of the eighth embodiment is different from that of the seventh embodiment in that the counters 411 to 414 are arranged without dividing the pixel block into a plurality of areas. Furthermore, four pixels are arranged in the pixel block 300. In the drawing, circuits (the output destination control circuit 370 and the like) other than the counter are omitted.

Furthermore, in the distance measuring mode, the counters 411 and 414 count the number of pulses in synchronization with the enable signals of 0 degrees and 180 degrees, and the counters 412 and 413 count the number of pulses in synchronization with the enable signals of 90 degrees and 270 degrees.

Figure 31:
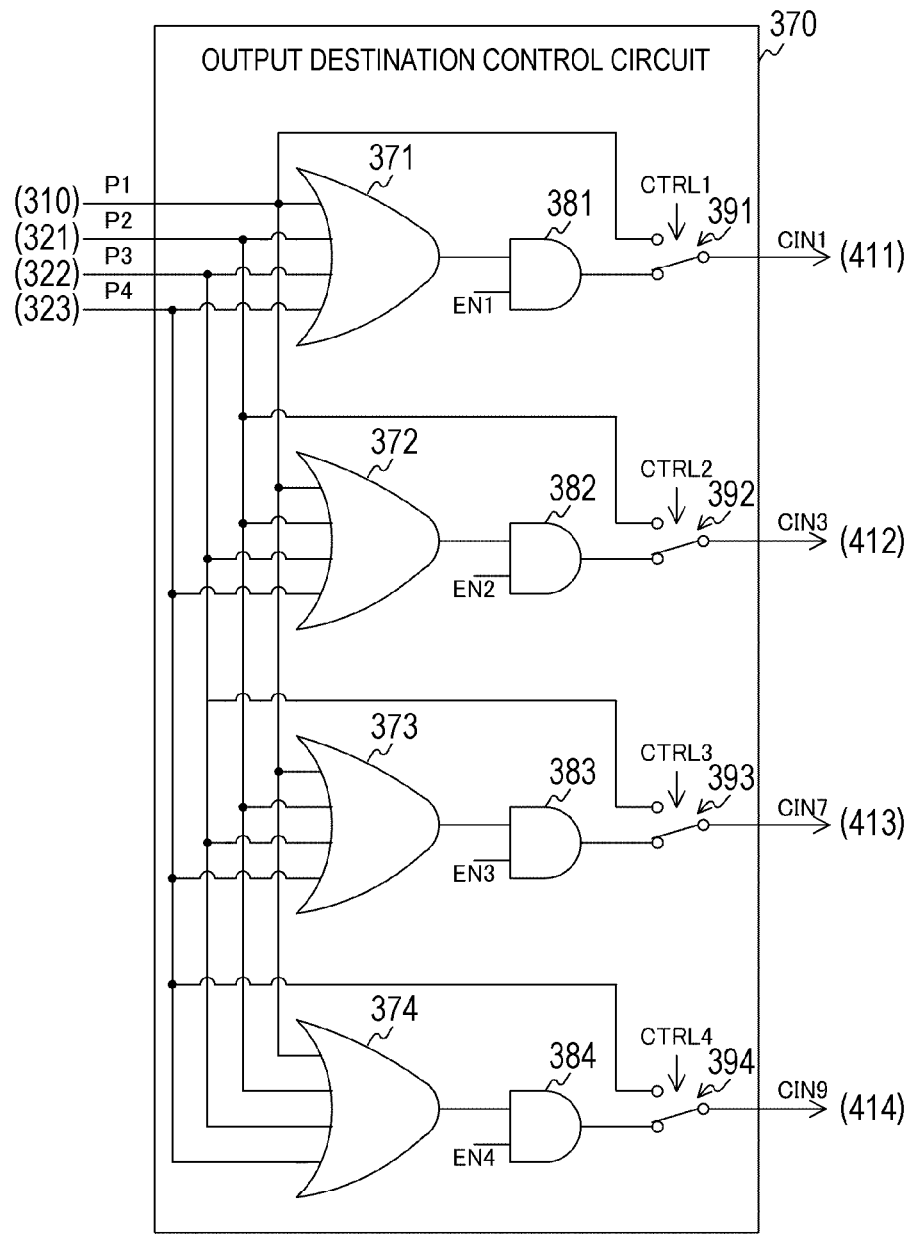
FIG. 31 is a circuit diagram depicting a configuration example of an output destination control circuit according to the eighth embodiment of the present technology.

FIG. 31 is a circuit diagram depicting a configuration example of the output destination control circuit 370 according to the eighth embodiment of the present technology. The output destination control circuit 370 of the eighth embodiment is provided with the OR gates 371 to 374, the AND gates 381 to 384, and the selectors 391 to 394.

The connection configurations of the OR gates 371 to 374, the AND gates 381 to 384, and the selectors 391 to 394 are similar to those of the OR gate 371, the AND gate 381, and the selector 391 of the second embodiment.

The enable signals EN1 to EN4 are input to the AND gates 381 to 384. The control signals CTRL1 to CTRL4 are input to the selectors 391 to 394. Furthermore, the selectors 391 to 394 select one of the pulse signals P1 to P4 and the signals from the AND gates 381 to 384, and supply, to the counters 411 to 414, the selected signal as the input signals CIN1 to CIN4.

Figure 32:
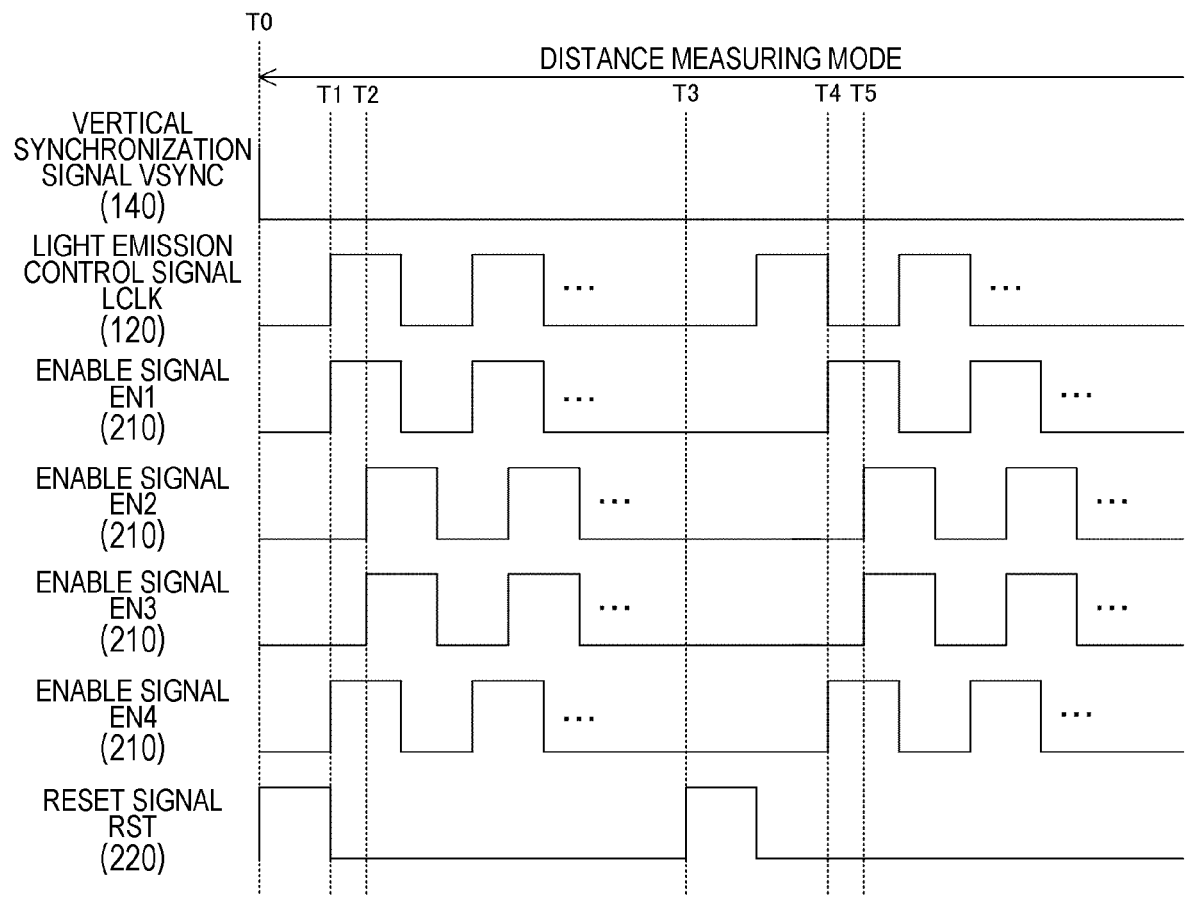
FIG. 32 is a timing chart illustrating an example of an operation of the solid-state imaging element in the distance measuring mode according to the eighth embodiment of the present technology.

FIG. 32 is a timing chart illustrating an example of the operation of the solid-state imaging element 200 in the distance measuring mode according to the eighth embodiment of the present technology. It is assumed that the distance measuring mode is set at timing T0. The processor 140 stops the supply of the vertical synchronization signal VSYNC. The vertical scanning circuit 220 supplies reset signals RST to the counters 331 to 334 to initialize the count values.

Furthermore, at timing T1, the driver 120 starts supplying the light emission control signal LCLK, and the light emitting section 110 emits light in synchronization with the signal. Furthermore, at the timing T1, the pixel drive section 210 starts supplying the enable signals EN1 and EN4 having a phase difference of 0 degrees from the light emission control signal LCLK. Then, at timing T2, the pixel drive section 210 starts supplying the enable signals EN2 and EN3 having a phase difference of 90 degrees.

Then, when a certain period has elapsed, the vertical scanning circuit 220 outputs the count values by the selection signal. The signal processing circuit 250 holds these count values.

Next, at timing T3, the vertical scanning circuit 220 supplies the reset signals RST to the counters 331 to 334 to initialize the count values. At timing T4, the pixel drive section 210 starts supplying the enable signals EN1 and EN4 having a phase difference of 180 degrees from the light emission control signal LCLK. Then, at timing T5, the pixel drive section 210 starts supplying the enable signals EN2 and EN3 having a phase difference of 270 degrees.

Then, when a certain period has elapsed, the vertical scanning circuit 220 outputs the count values by the selection signal. On the basis of the held count value and the output count value, the signal processing circuit 250 obtains the distance for every pixel block 300.

As illustrated in the drawing, the pixel drive section 210 supplies an enable signal in which each of a plurality of setting values (90 degrees, 270 degrees, and the like) is sequentially set to a phase difference. By switching the phase difference in this manner, the counter can count the number of pulses in synchronization with the enable signals having phase differences of 90 degrees and 270 degrees in addition to the enable signals having phase differences of 0 degrees and 180 degrees. Since the number of phase differences increases, the distance measurement accuracy can be improved, and the measurable distance range can be expanded.

Note that while all the four counters perform counting in the distance measuring mode, only two counters (such as the counters 411 and 412) can perform counting in the distance measuring mode. Power consumption can be reduced by reducing the number of counters operating in the distance measuring mode.

As described above, according to the eighth embodiment of the present technology, the pixel drive section 210 sequentially sets each of the plurality of setting values to the phase difference, and thus the number of phase differences can be increased. Therefore, the distance measurement accuracy can be improved, and the measurable distance range can be expanded.

9. Ninth Embodiment

In the above-described eighth embodiment, the pixel drive section 210 switches the phase difference. However, in this configuration, the distance measurement interval becomes longer than that in a case where the phase difference is fixed, and the frame rate of the depth map decreases. The solid-state imaging element 200 of a ninth embodiment is different from that of the eighth embodiment in that the phase difference is fixed and the frame rate of the depth map is improved.

Figure 33:
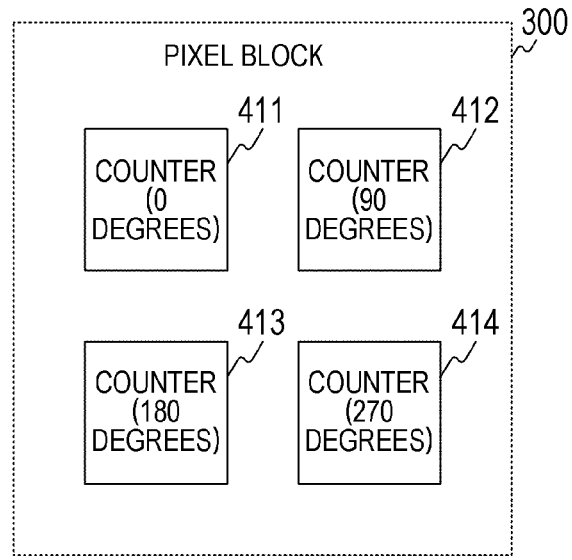
FIG. 33 is a diagram depicting an example of a circuit provided in a pixel block according to a ninth embodiment of the present technology.

FIG. 33 is a diagram depicting an example of a circuit provided in the pixel block 300 according to the ninth embodiment of the present technology. In the pixel block 300 of the ninth embodiment, the counters 411 to 414 are arranged similarly to that in the eighth embodiment.

However, the phase differences of the enable signals EN1 to EN4 are fixed in the distance measuring mode. For example, the counter 411 counts the number of pulses in synchronization with the enable signal EN1 of 0 degrees, and the counter 412 counts the number of pulses in synchronization with the enable signal EN2 of 90 degrees. The counter 413 counts the number of pulses in synchronization with the enable signal EN3 of 180 degrees, and the counter 414 counts the number of pulses in synchronization with the enable signal EN4 of 270 degrees. Since the phase differences are fixed, the frame rate of the depth map is improved as compared with the eighth embodiment.

As described above, according to the ninth embodiment of the present technology, the pixel drive section 210 fixes the phase differences of the enable signals, and thus the frame rate of the depth map can be improved as compared with the case of switching the phase difference.

10. Tenth Embodiment

In the ninth embodiment described above, the counter counts the number of pulses in units of four pixels in the distance measuring mode, but when the number of pixels to be counted increases, the maximum value of the count value increases and the data size of the count value increases. The solid-state imaging element 200 of a tenth embodiment is different from that of the ninth embodiment in that the number of pixels to be counted is switched between four pixels and two pixels, and the data size is made variable.

Figure 34:
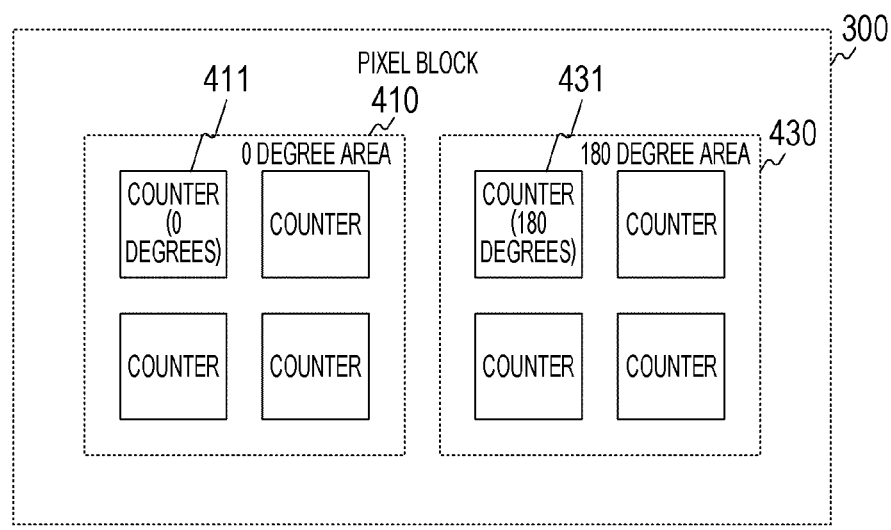
FIG. 34 is a diagram depicting an example of a circuit provided in a pixel block according to a tenth embodiment of the present technology.

FIG. 34 is a diagram depicting an example of a circuit provided in the pixel block according to the tenth embodiment of the present technology. In the pixel block 300 of the tenth embodiment, for example, the 0 degree area 410 and the 180 degree area 430 are provided. Furthermore, four pixels and the output destination control circuit 370 are provided for every area. In the distance measuring mode, one of four counters in the area counts the number of pulses in synchronization with the enable signal. In the imaging mode, each of the four counters counts the number of pulses in synchronization with the vertical synchronization signal.

Figures 35, 36:
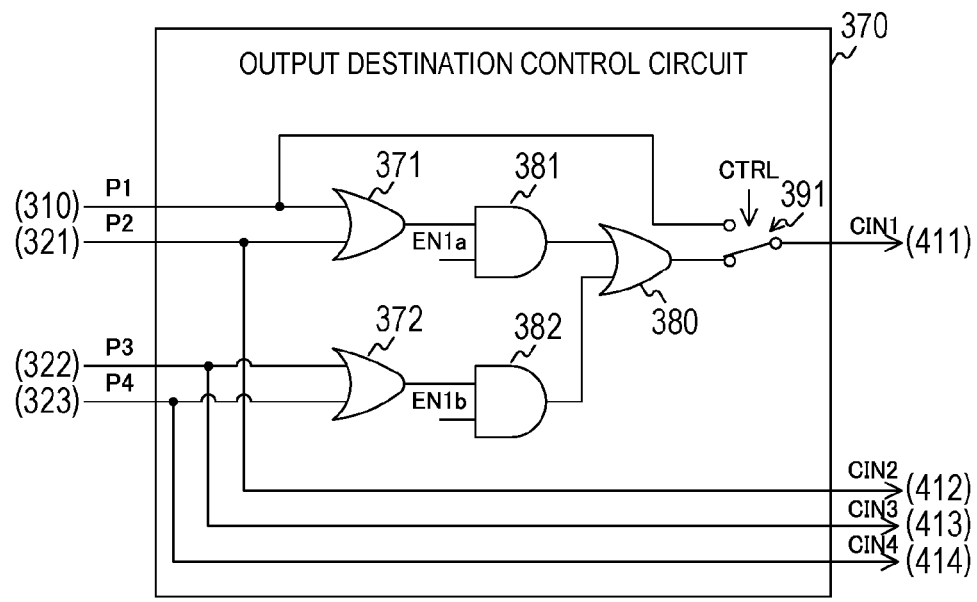
FIG. 35 is a circuit diagram depicting a configuration example of an output destination control circuit according to the tenth embodiment of the present technology.
FIG. 36 is a diagram for explaining an operation of a pixel drive section according to the tenth embodiment of the present technology.

FIG. 35 is a circuit diagram depicting a configuration example of the output destination control circuit 370 according to the tenth embodiment of the present technology. The output destination control circuit 370 of the tenth embodiment is provided with the OR gates 371, 372, and 380, the AND gates 381 and 382, and the selector 391.

The OR gate 371 supplies the logical sum of the pulse signals P1 and P2 to the AND gate 381. The OR gate 372 supplies the logical sum of the pulse signals P3 and P4 to the AND gate 382.

The AND gate 381 supplies the logical product of the signal from the OR gate 371 and an enable signal EN1a to the OR gate 380. The AND gate 382 supplies the logical product of the signal from the OR gate 372 and an enable signal EN1b to the OR gate 380.

The OR gate 380 outputs the logical sum of the signals from the AND gates 381 and 382 to the selector 391.

The selector 391 selects one of the pulse signal P1 and the signal from the OR gate 380 according to the control signal CTRL, and supplies, to the counter 411, the selected signal as the input signal CIN1.

Furthermore, the pulse signals P2 to P4 are directly supplied as the input signals CIN2 to CIN4 to the counters 412 to 414.

Note that the counter 411 is an example of the first counter described in the claims, and the counters 412 to 414 are examples of the second counter described in the claims.

FIG. 36 is a diagram for explaining the operation of the pixel drive section 210 according to the tenth embodiment of the present technology. The control in the drawing corresponds to the 0 degree area 410. In the tenth embodiment, either a four-pixel addition mode or a two-pixel addition mode is set as the distance measuring mode. The four-pixel addition mode is a mode in which the number of pixels to be counted in the pulse signal is four pixels, and the two-pixel addition mode is a mode in which the number of pixels to be counted in the pulse signal is two pixels.

In the four-pixel addition mode, the pixel drive section 210 supplies signals having a phase difference of 0 degrees as the enable signals EN1a and EN1b. In the two-pixel addition mode, the pixel drive section 210 supplies a signal having a phase difference of 0 degrees as one of the enable signals EN1a and EN1b. The other of the enable signals EN1a and EN1b is not supplied. Furthermore, in the imaging mode, the enable signal is not supplied. Note that the control of the 180 degree area 430 is similar to that of the 0 degree area 410 illustrated in the drawing except that the phase difference is set to 180 degrees.

Furthermore, the pixel drive section 210 sets the control signal CTRL to "0" and causes the selector 391 to select the signal from the OR gate 380 in the distance measuring mode. On the other hand, in the imaging mode, the pixel drive section 210 sets the control signal CTRL to "1" and causes the selector 391 to select the pulse signal P1.

With the configuration illustrated in FIGS. 35 and 36, the output destination control circuit 370 outputs the logical sum of respective pulse signals of the set number (four pixels or two pixels) of pixels among the four pixels in the pixel block 300, and the counter 411 counts the logical sum. Therefore, the number of pixels to be counted can be switched between four pixels and two pixels, and the data size of the count value can be changed.

Note that the pixel drive section 210 switches the number of pixels to be counted between four pixels and two pixels, but is not limited to this configuration, and for example, can switch to one pixel, three pixels, or the like.

As described above, according to the tenth embodiment of the present technology, the counter 411 counts the logical sum of the pulse signals of the set number of pixels among the four pixels in the pixel block 300, and thus the data size of the count value can be changed.

11. Application Example to Mobile Body

The technology (present technology) according to the present disclosure can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, and a robot.

Figure 37:
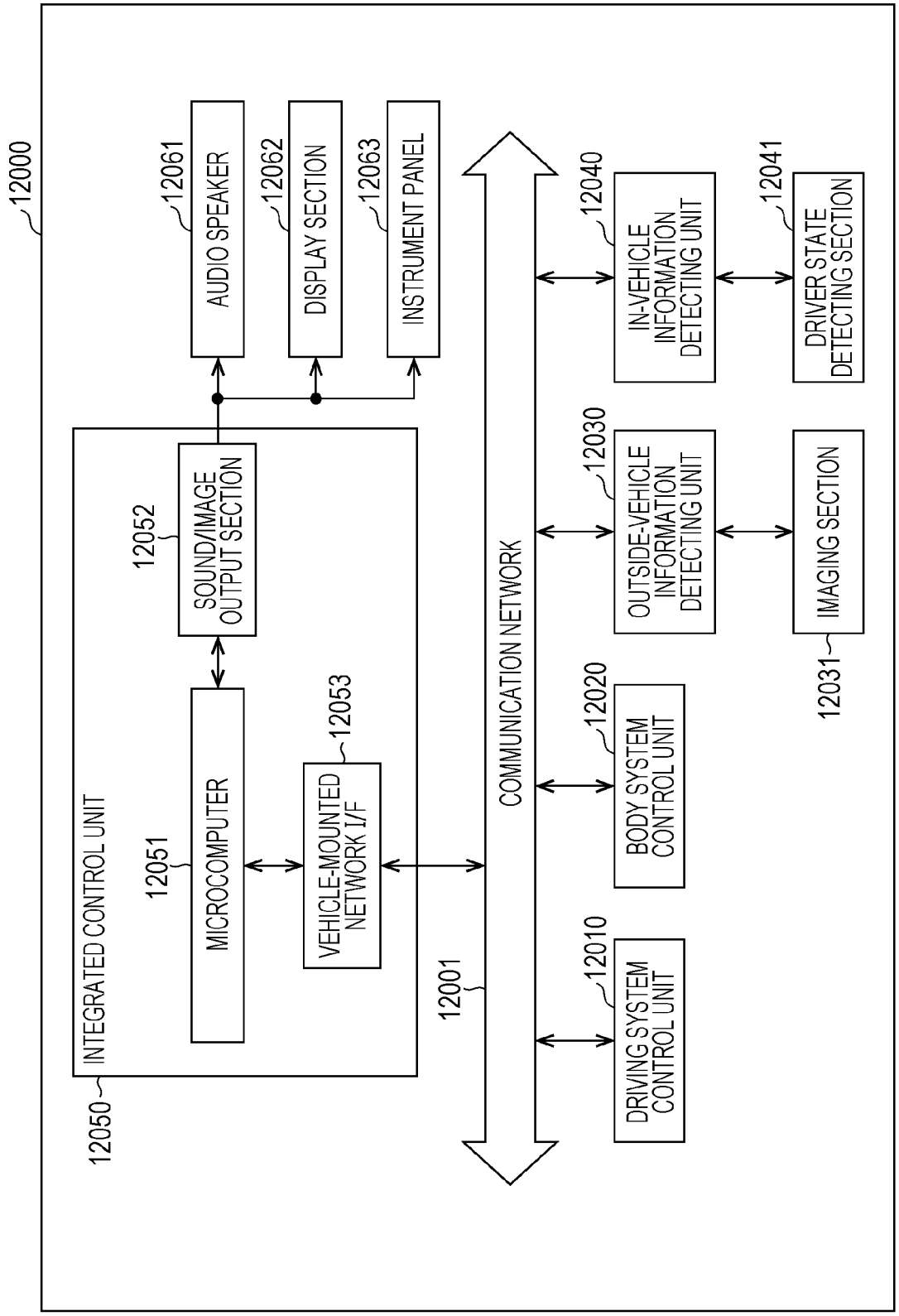
FIG. 37 is a block diagram depicting an example of schematic configuration of a vehicle control system.

FIG. 37 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example illustrated in FIG. 37, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

Furthermore, the microcomputer 12051 can perform cooperative control intended for automatic driving, which makes the vehicle travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 37, an audio speaker 12061, a display section 12062, and an instrument panel 12063 are illustrated as the output device. The display section 12062 may, for example, include at least one of an on-board display or a head-up display.

Figure 38:
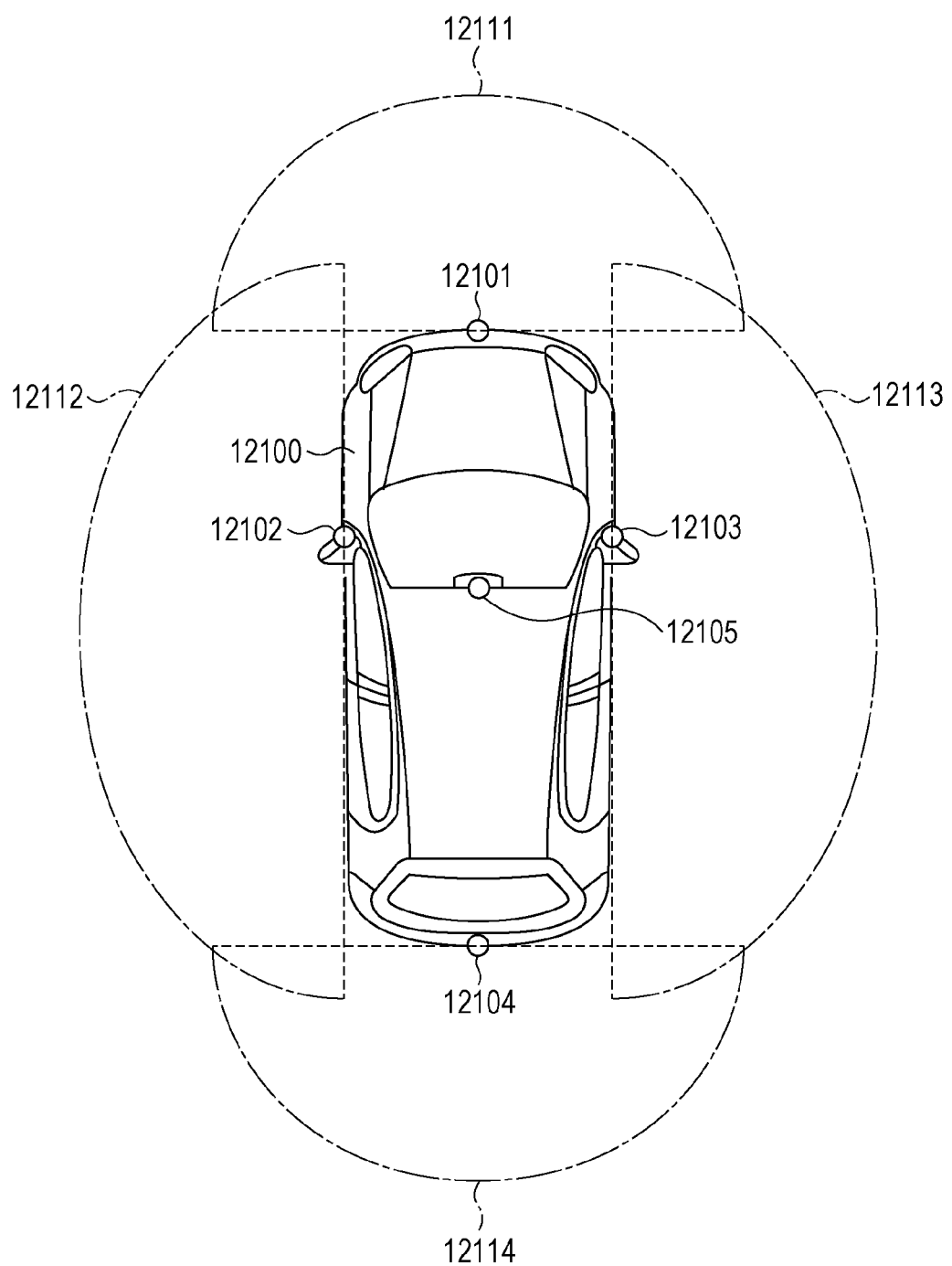
FIG. 38 is an explanatory diagram depicting an example of an installation position of an imaging section.

FIG. 38 is a diagram depicting an example of the installation position of the imaging section 12031.

In FIG. 38, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 38 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Moreover, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, and other three-dimensional objects such as a utility pole on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. Furthermore, the sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to, for example, the imaging section 12031 among the above-described configurations. Specifically, the solid-state imaging element 200 in FIG. 3 can be applied to the imaging section 12031. By applying the technology according to the present disclosure to the imaging section 12031, distance measurement can be performed without adding a sensor, so that power consumption and cost of the vehicle control system can be reduced.

Note that the above-described embodiment describes an example for embodying the present technology, and the matters in the embodiments and the invention specifying matters in the claims have a correspondence relationship. Similarly, the invention specifying matters in the claims and the matters in the embodiments of the present technology denoted by the same names as the invention specifying matters have a correspondence relationship. However, the present technology is not limited to the embodiments, and can be embodied by making various modifications to the embodiments without departing from the gist thereof.

Furthermore, the processing procedure described in the above-described embodiments may be regarded as a method including these series of procedures, and may be regarded as a program for causing a computer to execute these series of procedures or a recording medium storing the program. As this recording medium, for example, a compact disc (CD), a mini disc (MD), a digital versatile disc (DVD), a memory card, a Blu-ray (registered trademark) disc, or the like can be used.

Note that the effects described in the present specification are merely examples and are not limited, and other effects may be provided.

Note that the present technology can also have the following configurations.

(1) A sensing system including:
a light emitting section that emits irradiation light in synchronization with a light emission control signal having a higher frequency than a predetermined vertical synchronization signal;
a predetermined number of pixels that each generate a pulse signal by photoelectric conversion; and
a counting section that counts the number of the pulse signals in synchronization with each of the light emission control signal and the vertical synchronization signal.

(2) The sensing system according to (1), in which
the counting section includes
a first counter that counts the pulse signal in synchronization with the light emission control signal, and
a second counter that counts the pulse signal in synchronization with the vertical synchronization signal.

(3) The sensing system according to (1), in which
the counting section includes
a first counter that sequentially performs a process of counting the pulse signal in synchronization with the light emission control signal and a process of counting the pulse signal in synchronization with the vertical synchronization signal, and
a second counter that counts the pulse signal in synchronization with the vertical synchronization signal.

(4) The sensing system according to (3), in which
a pixel array section in which the predetermined number of pixels are arranged is divided into a plurality of pixel blocks,
the counting section is provided in every pixel block, and
the first counter counts a logical sum of the pulse signals from respective pixels in the pixel block.

(5) The sensing system according to (4), in which four of the first counters and five of the second counters are arranged in every pixel block.

(6) The sensing system according to (4), in which eight of the first counters and one of the second counter are arranged in every pixel block.

(7) The sensing system according to (3), in which
a pixel array section in which the predetermined number of pixels are arranged is divided into a plurality of pixel blocks,
each of the plurality of pixel blocks is divided into a plurality of areas,
the counting section is provided to correspond to each of the plurality of areas, and
the first counter counts a logical sum of the pulse signals from respective pixels in a corresponding area.

(8) The sensing system according to (7), in which nine of the pixels are arranged in each of the plurality of areas.

(9) The sensing system according to (7), in which four of the pixels are arranged in each of the plurality of areas.

(10) The sensing system according to any one of (7) to (9), in which four areas are arranged in the pixel block.

(11) The sensing system according to any one of (7) to (9), in which two areas are arranged in the pixel block.

(12) The sensing system according to any one of (7) to (9), in which
the first counter counts a logical sum of respective pulse signals of a set number of pixels among the pixels in the pixel block.

(13) The sensing system according to (1), in which
the counting section includes a predetermined number of counters that sequentially perform a process of counting the pulse signal in synchronization with the light emission control signal and a process of counting the pulse signal in synchronization with the vertical synchronization signal.

(14) The sensing system according to (13), in which
the counting section includes nine of the counters.

(15) The sensing system according to (13), in which
the counting section includes four of the counters.

(16) The sensing system according to any one of (13) to (15), further including:
a pixel drive section that supplies an enable signal in which each of a plurality of set values is sequentially set as a phase difference from the light emission control signal, in which
the counter supplies the pulse signal in synchronization with the enable signal.

(17) A distance measuring system including:
a light emitting section that emits irradiation light in synchronization with a light emission control signal having a higher frequency than a predetermined vertical synchronization signal;
a predetermined number of pixels that each generate a pulse signal by photoelectric conversion;
a counting section that counts the number of the pulse signals in synchronization with each of the light emission control signal and the vertical synchronization signal; and
a distance measuring section that measures a distance to an object on the basis of a count value of the counting section.

(18) A sensing system including:
a light emitting section that emits irradiation light on the basis of a light emission control signal;
a plurality of pixels each generating a pulse signal by photoelectric conversion; and
a counting section that counts the number of pulse signals of the plurality of pixels, in which
the counting section includes a plurality of counters and an output destination control circuit that is connected between the plurality of pixels and the plurality of counters, receives a plurality of pulse signals output from the plurality of pixels, and distributes the plurality of pulse signals to a plurality of arbitrary counters,
the plurality of pixels is provided in a first chip, and
the output control circuit and the counting section are provided in a second chip.

REFERENCE SIGNS LIST

100 Distance measuring system
105 Microlens
110 Light emitting section
120 Driver
130 Controller
140 Processor
150 Application processor
200 Solid-state imaging element
201 Pixel chip
202 Circuit chip
210 Pixel drive section
220 Vertical scanning circuit
230 Pixel array section
240 Column buffer
250 Signal processing circuit
260 Output section
300 Pixel block
310, 321 to 328 Pixel
311 SPAD
312 Resistor
313 Inverter
330 Counting section
331 to 343, 411 to 414, 421, 431, 441 Counter
351 to 363 Switch
370 Output destination control circuit
371 to 380 OR (logical sum) gate
381 to 389 AND (logical product) gate
391 to 399 Selector
410 0 degree area
420 90 degree area
430 180 degree area
440 270 degree area
12031 Imaging section

The invention claimed is:

1. A sensing system, comprising:
a light emitting section configured to emit irradiation light in synchronization with a light emission control signal having a higher frequency than a predetermined vertical synchronization signal;
a predetermined number of pixels, wherein each pixel of the predetermined number of pixels is configured to generate a pulse signal by photoelectric conversion; and
a counting section configured to count a number of pulse signals in synchronization with each of the light emission control signal and the predetermined vertical synchronization signal.

2. The sensing system according to claim 1, wherein
the counting section includes
a first counter configured to count the pulse signal in synchronization with the light emission control signal, and
a second counter configured to count the pulse signal in synchronization with the predetermined vertical synchronization signal.

3. The sensing system according to claim 1, wherein the counting section includes
a first counter configured to sequentially perform a process of counting the pulse signal in synchronization with the light emission control signal and a process of counting the pulse signal in synchronization with the predetermined vertical synchronization signal, and
a second counter configured to count the pulse signal in synchronization with the predetermined vertical synchronization signal.

4. The sensing system according to claim 3, wherein
a pixel array section in which the predetermined number of pixels are arranged is divided into a plurality of pixel blocks,
the counting section is provided in every pixel block of the plurality of pixel blocks, and
the first counter is further configured to count a logical sum of the pulse signals from respective pixels in a pixel block of the plurality of pixel blocks.

5. The sensing system according to claim 4, wherein four of first counters and five of second counters are arranged in every pixel block of the plurality of pixel blocks.

6. The sensing system according to claim 4, wherein eight of first counters and one of second counters are arranged in every pixel block of the plurality of pixel blocks.

7. The sensing system according to claim 3, wherein
a pixel array section in which the predetermined number of pixels are arranged is divided into a plurality of pixel blocks,
each of the plurality of pixel blocks is divided into a plurality of areas,
the counting section is provided to correspond to each of the plurality of areas, and
the first counter is further configured to count a logical sum of the pulse signals from respective pixels in a corresponding area.

8. The sensing system according to claim 7, wherein nine of the predetermined number of pixels are arranged in each of the plurality of areas.

9. The sensing system according to claim 7, wherein four of the predetermined number of pixels are arranged in each of the plurality of areas.

10. The sensing system according to claim 7, wherein four areas of the plurality of areas are arranged in a pixel block of the plurality of pixel blocks.

11. The sensing system according to claim 7, wherein two areas of the plurality of areas are arranged in a pixel block of the plurality of pixel blocks.

12. The sensing system according to claim 7, wherein the first counter is further configured to count a logical sum of respective pulse signals of a set number of pixels among the predetermined number of pixels in the corresponding area.

13. The sensing system according to claim 1, wherein the counting section includes a predetermined number of counters configured to sequentially perform a process of counting the pulse signal in synchronization with the light emission control signal and a process of counting the pulse signal in synchronization with the predetermined vertical synchronization signal.

14. The sensing system according to claim 13, wherein the counting section includes nine of the predetermined number of counters.

15. The sensing system according to claim 13, wherein the counting section includes four of the predetermined number of counters.

16. The sensing system according to claim 13, further comprising:
a pixel drive section configured to supply an enable signal in which each of a plurality of set values is sequentially set as a phase difference from the light emission control signal,
wherein a counter of the predetermined number of counters is configured to supply the pulse signal in synchronization with the enable signal.

17. A distance measuring system, comprising:
a light emitting section configured to emit irradiation light in synchronization with a light emission control signal having a higher frequency than a predetermined vertical synchronization signal;
a predetermined number of pixels, wherein each pixel of the predetermined number of pixels is configured to generate a pulse signal by photoelectric conversion;
a counting section configured to count a number of pulse signals in synchronization with each of the light emission control signal and the predetermined vertical synchronization signal; and
a distance measuring section configured to measure a distance to an object based on a count value of the counting section.

* * * * *